(12) United States Patent
Klosterman et al.

(10) Patent No.: US 8,254,166 B2
(45) Date of Patent: *Aug. 28, 2012

(54) INTEGRATED CIRCUIT INCLUDING DOPED SEMICONDUCTOR LINE HAVING CONDUCTIVE CLADDING

(75) Inventors: Ulrich Klosterman, Perlach Munich (DE); Ulrike Gruening-von Schwerin, Munich (DE); Franz Kreupl, Munich (DE)

(73) Assignee: Qimonda AG, Munich (DE)

( * ) Notice: Subject to any disclaimer, the term of this patent is extended or adjusted under 35 U.S.C. 154(b) by 1009 days.

This patent is subject to a terminal disclaimer.

(21) Appl. No.: 12/206,439

(22) Filed: Sep. 8, 2008

(65) Prior Publication Data

US 2010/0061140 A1    Mar. 11, 2010

Related U.S. Application Data

(63) Continuation of application No. 11/931,449, filed on Oct. 31, 2007, now Pat. No. 8,084,759.

(51) Int. Cl.
*G11C 11/36* (2006.01)
*H01L 21/441* (2006.01)

(52) U.S. Cl. ............ 365/175; 365/174; 365/51; 365/72; 365/63; 438/652

(58) Field of Classification Search .................. 365/175, 365/174, 51, 72, 63; 438/652, 597
See application file for complete search history.

(56) References Cited

U.S. PATENT DOCUMENTS 8,084,759 B2 * 12/2011 Klostermann et al. ............ 257/2
2009/0108248 A1 * 4/2009 Klostermann et al. ............ 257/2

* cited by examiner

*Primary Examiner* — Andrew Q Tran
(74) *Attorney, Agent, or Firm* — Dicke, Billig & Czaja, PLLC

(57) ABSTRACT

An integrated circuit includes an array of memory cells. Each memory cell includes a diode. The integrated circuit includes a doped semiconductor line formed in a semiconductor substrate. The doped semiconductor line is coupled to a row of diodes. The integrated circuit includes conductive cladding contacting the doped semiconductor line.

25 Claims, 31 Drawing Sheets

INTEGRATED CIRCUIT INCLUDING DOPED SEMICONDUCTOR LINE HAVING CONDUCTIVE CLADDING

CROSS-REFERENCE TO RELATED APPLICATIONS

This patent application is related to U.S. patent application Ser. No. 11/931,449 entitled "INTEGRATED CIRCUIT INCLUDING DOPED SEMICONDUCTOR LINE HAVING CONDUCTIVE CLADDING," filed Oct. 31, 2007, and which is incorporated herein by reference.

BACKGROUND

One type of memory is resistive memory. Resistive memory utilizes the resistance value of a memory element to store one or more bits of data. For example, a memory element programmed to have a high resistance value may represent a logic "1" data bit value and a memory element programmed to have a low resistance value may represent a logic "0" data bit value. Typically, the resistance value of the memory element is switched electrically by applying a voltage pulse or a current pulse to the memory element.

One type of resistive memory is phase change memory. Phase change memory uses a phase change material in the resistive memory element. The phase change material exhibits at least two different states. The states of the phase change material may be referred to as the amorphous state and the crystalline state, where the amorphous state involves a more disordered atomic structure and the crystalline state involves a more ordered lattice. The amorphous state usually exhibits higher resistivity than the crystalline state. Also, some phase change materials exhibit multiple crystalline states, e.g. a face-centered cubic (FCC) state and a hexagonal closest packing (HCP) state, which have different resistivities and may be used to store bits of data. In the following description, the amorphous state generally refers to the state having the higher resistivity and the crystalline state generally refers to the state having the lower resistivity.

Phase changes in the phase change materials may be induced reversibly. In this way, the memory may change from the amorphous state to the crystalline state and from the crystalline state to the amorphous state in response to temperature changes. The temperature changes of the phase change material may be achieved by driving current through the phase change material itself or by driving current through a resistive heater adjacent the phase change material. With both of these methods, controllable heating of the phase change material causes controllable phase change within the phase change material.

A phase change memory including a memory array having a plurality of memory cells that are made of phase change material may be programmed to store data utilizing the memory states of the phase change material. One way to read and write data in such a phase change memory device is to control a current and/or a voltage pulse that is applied to the phase change material. The temperature in the phase change material in each memory cell generally corresponds to the applied level of current and/or voltage to achieve the heating.

To achieve higher density phase change memories, a phase change memory cell can store multiple bits of data. Multi-bit storage in a phase change memory cell can be achieved by programming the phase change material to have intermediate resistance values or states, where the multi-bit or multilevel phase change memory cell can be written to more than two states. If the phase change memory cell is programmed to one of three different resistance levels, 1.5 bits of data per cell can be stored. If the phase change memory cell is programmed to one of four different resistance levels, two bits of data per cell can be stored, and so on. To program a phase change memory cell to an intermediate resistance value, the amount of crystalline material coexisting with amorphous material and hence the cell resistance is controlled via a suitable write strategy.

One type of memory array includes heavily doped silicon lines or wires for selecting memory cells for read and write access. The heavily doped silicon lines can carry programming current, read current, or provide a potential mesh, such as a common or ground. The current densities of the lines, however, are limited and the resistivity of the lines is often high leading to undesirable voltage drops across the lines. In memory arrays using diode select devices, the lines increase cross-talk between the memory cells.

For these and other reasons, there is a need for the present invention.

SUMMARY

One embodiment provides an integrated circuit. The integrated circuit includes an array of memory cells. Each memory cell includes a diode. The integrated circuit includes a doped semiconductor line formed in a semiconductor substrate. The doped semiconductor line is coupled to a row of diodes. The integrated circuit includes conductive cladding contacting the doped semiconductor line.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
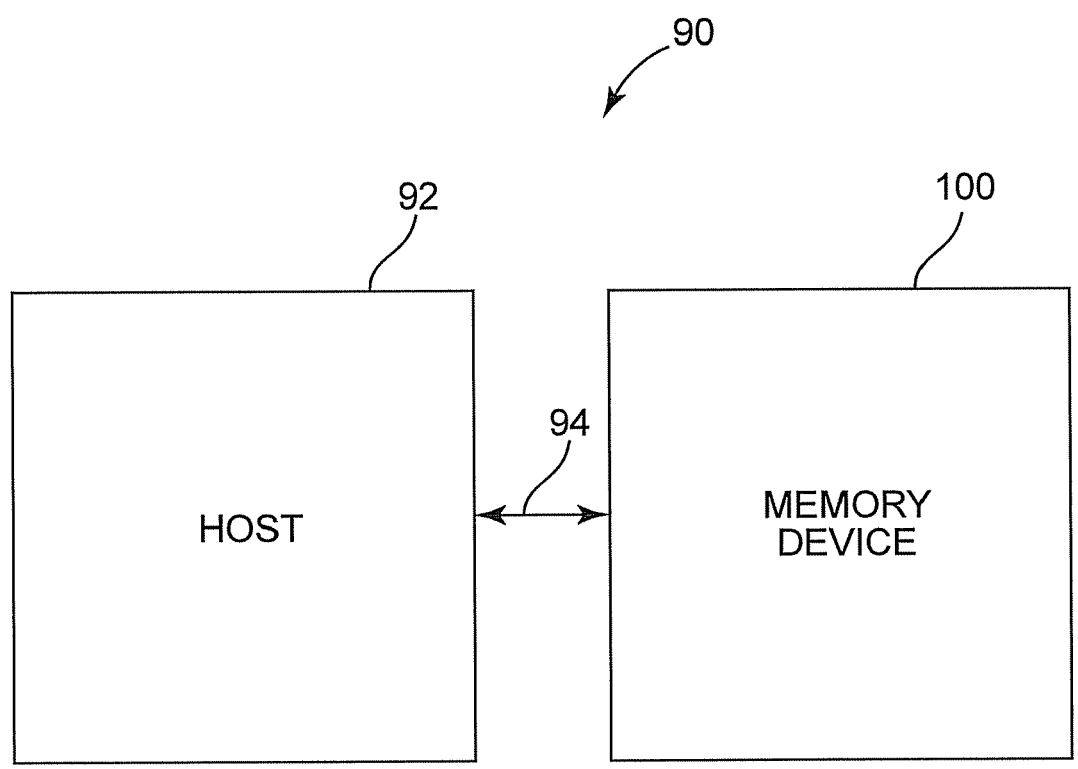
FIG. 1 is a block diagram illustrating one embodiment of a system.

FIG. 1 is a block diagram illustrating one embodiment of a system 90. System 90 includes a host 92 and a memory device 100. Host 92 is communicatively coupled to memory device 100 through communication link 94. Host 92 includes a computer (e.g., desktop, laptop, handheld), portable electronic device (e.g., cellular phone, personal digital assistant (PDA), MP3 player, video player), or any other suitable device that uses memory. Memory device 100 provides memory for host 92. In one embodiment, memory device 100 includes a phase change memory device or other suitable resistive or resistivity changing material memory device.

Figure 2:
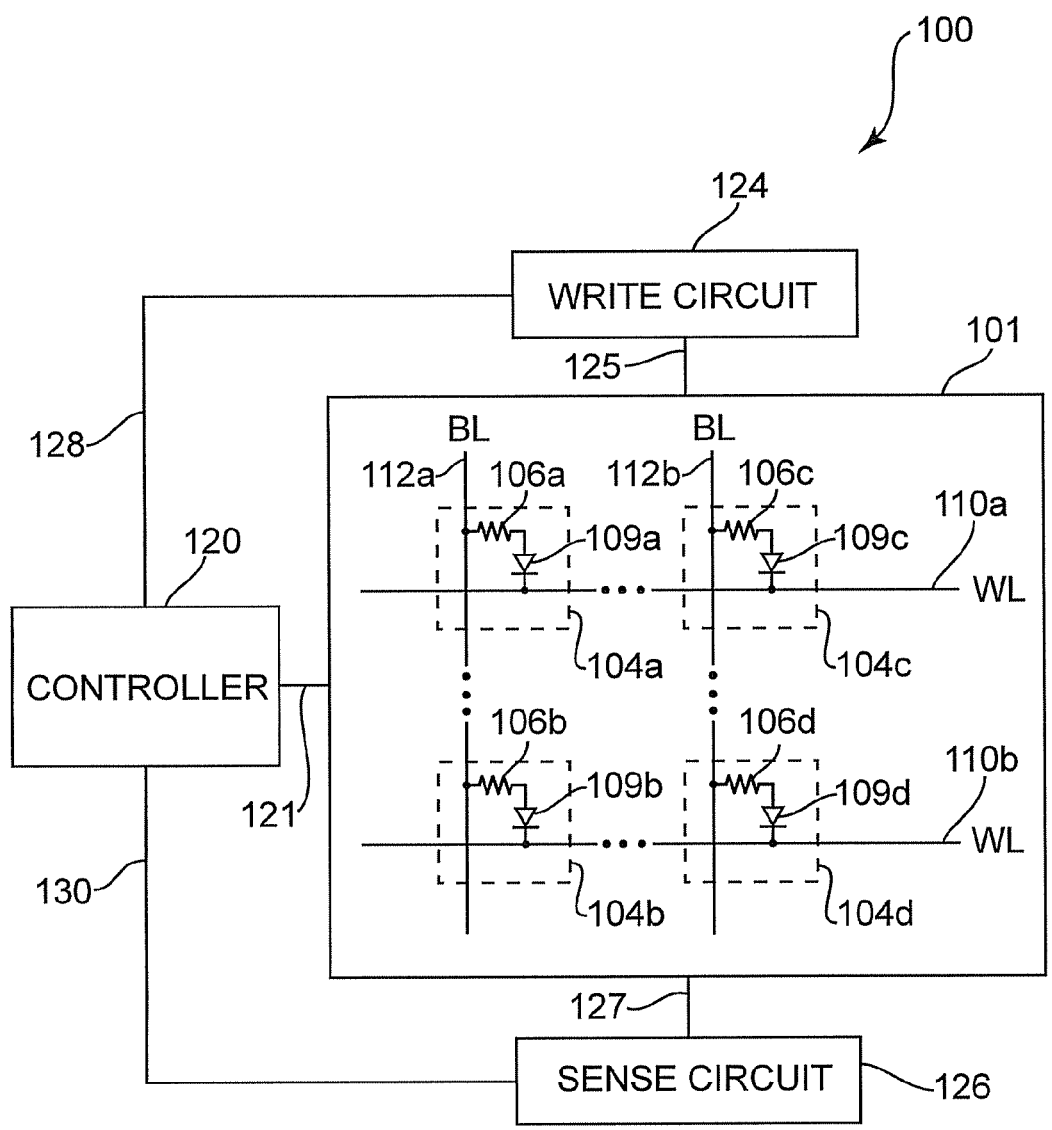
FIG. 2 is a diagram illustrating one embodiment of a memory device.

FIG. 2 is a diagram illustrating one embodiment of memory device 100. In one embodiment, memory device 100 is an integrated circuit or part of an integrated circuit. Memory device 100 includes a write circuit 124, a controller 120, a memory array 101, and a sense circuit 126. Memory array 101 includes a plurality of phase change memory cells 104a-104d (collectively referred to as phase change memory cells 104), a plurality of bit lines (BLs) 112a-112b (collectively referred to as bit lines 112), and a plurality of word lines (WLs) 110a-110b (collectively referred to as word lines 110). In one embodiment, phase change memory cells 104a-104d are arranged in rows and columns.

In one embodiment, word lines 110 are formed in a semiconductor substrate by doping the semiconductor substrate and forming isolation regions to provide doped lines of semiconductor material. In one embodiment, the semiconductor substrate is a single crystal silicon substrate and the doped lines are N+ doped silicon lines. The doped lines include a conductive cladding that increases the current density for the lines and reduces the overall resistivity of the lines. The conductive cladding includes C, TiN, a silicide, a gas immersion laser doped (GILD) material, or another suitable material. In addition, the doped lines with conductive cladding reduce the voltage drop across the lines and therefore can be used without area consuming stitching to back end of line (BEOL) metallization levels.

As used herein, the term "electrically coupled" is not meant to mean that the elements must be directly coupled together and intervening elements may be provided between the "electrically coupled" elements.

Memory array 101 is electrically coupled to write circuit 124 through signal path 125, to controller 120 through signal path 121, and to sense circuit 126 through signal path 127. Controller 120 is electrically coupled to write circuit 124 through signal path 128 and to sense circuit 126 through signal path 130. Each phase change memory cell 104 is electrically coupled to a word line 110 and a bit line 112. Phase change memory cell 104a is electrically coupled to bit line 112a and word line 110a, and phase change memory cell 104b is electrically coupled to bit line 112a and word line 110b. Phase change memory cell 104c is electrically coupled to bit line 112b and word line 110a, and phase change memory cell 104d is electrically coupled to bit line 112b and word line 110b.

Each phase change memory cell 104 includes a phase change element 106 and a diode 109. In one embodiment, the polarity of diodes 109 is reversed. Phase change memory cell 104a includes phase change element 106a and diode 109a. One side of phase change element 106a is electrically coupled to bit line 112a, and the other side of phase change element 106a is electrically coupled to one side of diode 109a. The other side of diode 109a is electrically coupled to word line 110a.

Phase change memory cell 104b includes phase change element 106b and diode 109b. One side of phase change element 106b is electrically coupled to bit line 112a, and the other side of phase change element 106b is electrically coupled to one side of diode 109b. The other side of diode 109b is electrically coupled to word line 110b.

Phase change memory cell 104c includes phase change element 106c and diode 109c. One side of phase change element 106c is electrically coupled to bit line 112b and the other side of phase change element 106c is electrically coupled to one side of diode 109c. The other side of diode 109c is electrically coupled to word line 110a.

Phase change memory cell 104d includes phase change element 106d and diode 109d. One side of phase change element 106d is electrically coupled to bit line 112b and the other side of phase change element 106d is electrically coupled to one side of diode 109d. The other side of diode 109d is electrically coupled to word line 110b.

In another embodiment, each phase change element 106 is electrically coupled to a word line 110 and each diode 109 is electrically coupled to a bit line 112. For example, for phase change memory cell 104a, one side of phase change element 106a is electrically coupled to word line 110a. The other side of phase change element 106a is electrically coupled to one side of diode 109a. The other side of diode 109a is electrically coupled to bit line 112a.

Each phase change element 106 comprises a phase change material that may be made up of a variety of materials. Generally, chalcogenide alloys that contain one or more elements from group VI of the periodic table are useful as such materials. In one embodiment, the phase change material of phase change element 106 is made up of a chalcogenide compound material, such as GeSbTe, SbTe, GeTe or AgInSbTe. In another embodiment, the phase change material is chalcogen free, such as GeSb, GaSb, InSb, or GeGaInSb. In other embodiments, the phase change material is made up of any suitable material including one or more of the elements Ge, Sb, Te, Ga, As, In, Se, and S.

Each phase change element 106 may be changed from an amorphous state to a crystalline state or from a crystalline state to an amorphous state under the influence of temperature change. The amount of crystalline material coexisting with amorphous material in the phase change material of one of the phase change elements 106a-106d thereby defines two or more states for storing data within memory device 100. In the amorphous state, a phase change material exhibits significantly higher resistivity than in the crystalline state. Therefore, the two or more states of phase change elements 106a-106d differ in their electrical resistivity. In one embodiment, the two or more states are two states and a binary system is used, wherein the two states are assigned bit values of "0" and "1". In another embodiment, the two or more states are three states and a ternary system is used, wherein the three states are assigned bit values of "0", "1", and "2". In another embodiment, the two or more states are four states that can be assigned multi-bit values, such as "00", "01", "10", and "11". In other embodiments, the two or more states can be any suitable number of states in the phase change material of a phase change element.

Controller 120 includes a microprocessor, microcontroller, or other suitable logic circuitry for controlling the operation of memory device 100. Controller 120 controls read and write operations of memory device 100 including the application of control and data signals to memory array 101 through write circuit 124 and sense circuit 126. In one embodiment, write circuit 124 provides voltage pulses through signal path 125 and bit lines 112 to memory cells 104 to program the memory cells. In other embodiments, write circuit 124 provides current pulses through signal path 125 and bit lines 112 to memory cells 104 to program the memory cells.

Sense circuit 126 reads each of the two or more states of memory cells 104 through bit lines 112 and signal path 127. In one embodiment, to read the resistance of one of the memory cells 104, sense circuit 126 provides current that flows through one of the memory cells 104. Sense circuit 126 then reads the voltage across that one of the memory cells 104. In another embodiment, sense circuit 126 provides voltage across one of the memory cells 104 and reads the current that flows through that one of the memory cells 104. In another embodiment, write circuit 124 provides voltage across one of the memory cells 104 and sense circuit 126 reads the current that flows through that one of the memory cells 104. In another embodiment, write circuit 124 provides current that flows through one of the memory cells 104 and sense circuit 126 reads the voltage across that one of the memory cells 104.

During a set operation of phase change memory cell 104a, one or more set current or voltage pulses are selectively enabled by write circuit 124 and sent through bit line 112a to phase change element 106a thereby heating phase change element 106a above its crystallization temperature (but usually below its melting temperature). In this way, phase change element 106a reaches its crystalline state or a partially crystalline and partially amorphous state during this set operation.

During a reset operation of phase change memory cell 104a, a reset current or voltage pulse is selectively enabled by write circuit 124 and sent through bit line 112a to phase change element 106a. The reset current or voltage quickly heats phase change element 106a above its melting temperature. After the current or voltage pulse is turned off, phase change element 106a quickly quench cools into the amorphous state or a partially amorphous and partially crystalline state. Phase change memory cells 104b-104d and other phase change memory cells 104 in memory array 101 are set and reset similarly to phase change memory cell 104a using a similar current or voltage pulse.

Embodiments relate to new memory technologies based on silicon technology, especially to the reduction of the wire resistance of doped silicon wires used in the memory array for cell selection. For novel and future memory cell devices, such as phase change random access memory (PCRAM) or magnetic random access memories (MRAM) cell devices, a high performance select array device is used to switch high select currents and/or high select voltages. In this case, it is desirable to reduce the line resistances of the select device to a minimal value. The select device is typically a select diode, a bipolar transistor, or a field effect transistor (FET) like transistor.

Typically, memory arrays use heavily doped silicon wires for cell device selection. These wires are used to carry the programming or read current. These wires can also serve as potential mesh (e.g. ground). The current densities, however, are limited and the resistance of these wires is often too high leading to a harmful voltage drop across the line and undesired power losses along the line resistances.

Embodiments propose to implement high conductive cladding lines partly around the doped silicon to benefit from multiple advantages including:

The conductive cladding allows significant high current densities that are important to operate novel memory cell concepts at reduced dimensions.

The conductive cladding results in a low voltage drop across the line, thus resulting also in reduced power consumption and reduced cross talk effects.

In combination with diode like cross point select devices, a viable realization is possible.

The conductive cladding leads to a reduction of diode cross talk.

The proposed concept is applicable for conventional silicon wafer substrates and silicon on insulator (SOI) wafers.

A low resistive connection is obtained without area consuming stitching to BEOL levels.

The manufacturing of the conductive cladding lines can either be chronologically separated from the select device manufacturing process or be included within the select device manufacturing steps. The incorporation of fabrication of the conductive cladding lines can be different for diode based select devices, bipolar transistor select devices, or FET like select devices. Further, as an option the conductive cladding lines can directly contact the memory cell. As a further option, the select device is indirectly coupled to the cladding lines via the memory cell.

Figure 3A:
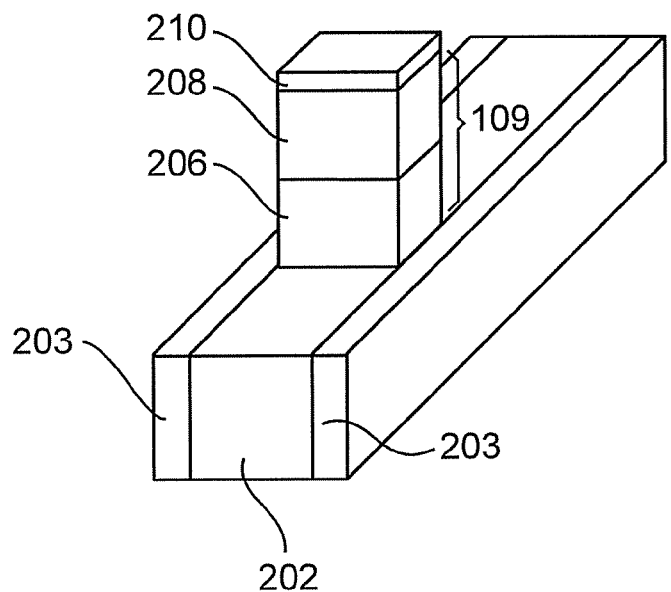
FIG. 3A illustrates a perspective view of one embodiment of a diode and a doped semiconductor line including conductive cladding.

FIG. 3A illustrates a perspective view of one embodiment of a diode 109 and a doped semiconductor line 202 including conductive cladding 203. In one embodiment, doped semiconductor line 202 is an N+ doped silicon line formed from a silicon substrate. Conductive cladding 203 laterally surrounds doped semiconductor line 202. Conductive cladding 203 includes C, TiN, a silicide, a GILD material, or another suitable conductive material. In one embodiment, conductive cladding 203 contacts one vertical sidewall of doped semiconductor line 202 and not the other vertical sidewall of doped semiconductor line 202. In one embodiment, a diode 109 including an N− doped silicon region 206 and a P+ doped silicon region 208 contacts doped semiconductor line 202. A silicide contact 210 contacts P+ doped silicon region 208. In one embodiment, silicide contact 210 includes $CoSi_2$, $TiSi_2$, NiSi, or another suitable silicide. In one embodiment, word lines 110 (FIG. 2) are similar to doped semiconductor line 202 with conductive cladding 203.

Figure 3B:
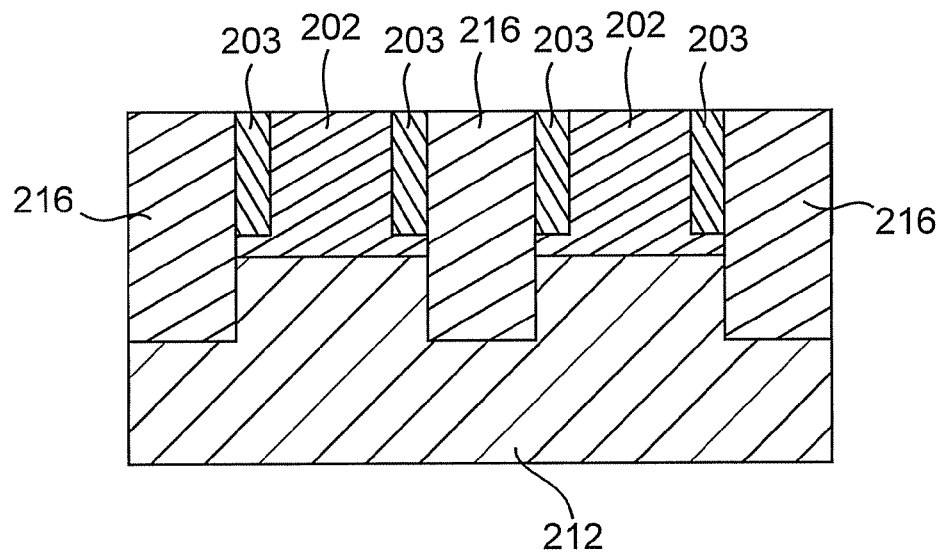
FIG. 3B illustrates a cross-sectional view of one embodiment of doped semiconductor lines including conductive cladding.

FIG. 3B illustrates a cross-sectional view of one embodiment of doped semiconductor lines 202 including conductive cladding 203. Doped semiconductor lines 202 are formed in substrate 212. Isolation regions 216, such as shallow trench isolation (STI) or other suitable isolation, electrically isolates adjacent doped semiconductor lines 202 including conductive cladding 203 from each other. In one embodiment, the bottom and one sidewall of conductive cladding 203 contacts doped semiconductor line 202. In one embodiment, to improve the isolation between adjacent doped semiconductor lines 202 including conductive cladding 203, substrate 212 is properly doped. Both, STI isolation and proper doping is used to suppress leakage currents between neighboring lines 202.

Figure 4:
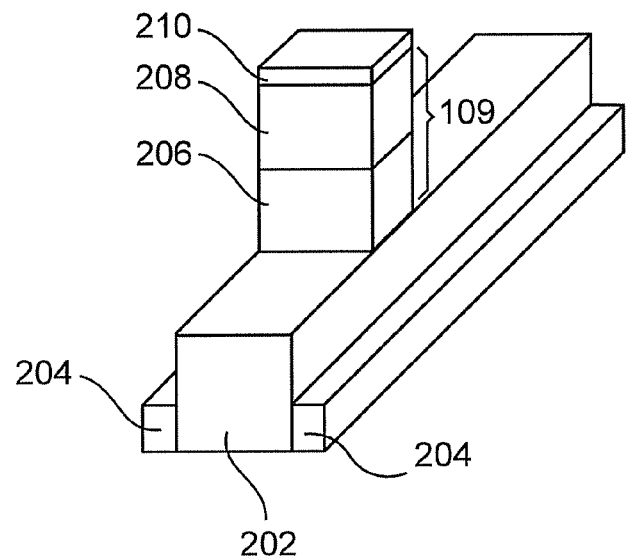
FIG. 4 illustrates a perspective view of another embodiment of a diode and a doped semiconductor line including conductive cladding.

FIG. 4 illustrates a perspective view of another embodiment of a diode 109 and a doped semiconductor line 202 including conductive cladding 204. This embodiment is similar to the embodiment previously described and illustrated with reference to FIG. 3A, except that in this embodiment conductive cladding 203 is replaced by conductive cladding 204. Conductive cladding 204 laterally encloses a portion of doped semiconductor line 202. In one embodiment, the bottom and one sidewall of conductive cladding 204 contacts doped semiconductor line 202. In one embodiment, conductive cladding 204 contacts one vertical sidewall of doped semiconductor line 202 and not the other vertical sidewall of doped semiconductor line 202.

Figure 5:
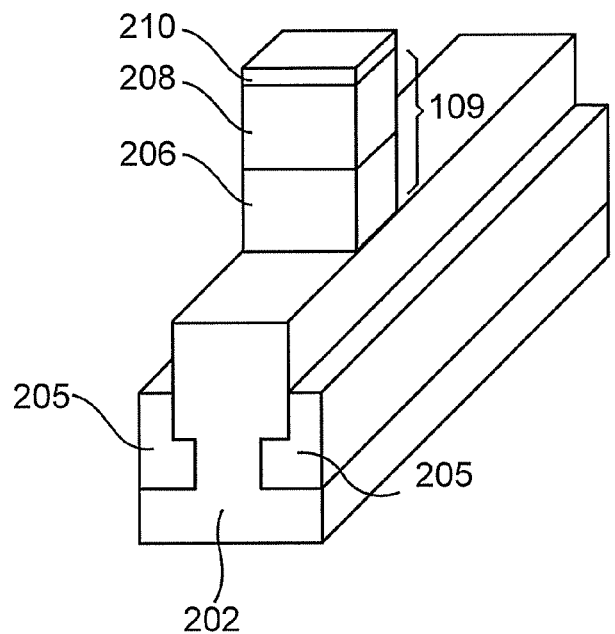
FIG. 5 illustrates a perspective view of another embodiment of a diode and a doped semiconductor line including conductive cladding.

FIG. 5 illustrates a perspective view of another embodiment of a diode 109 and a doped semiconductor line 202 including conductive cladding 205. This embodiment is similar to the embodiment previously described and illustrated with reference to FIG. 3A, except that in this embodiment conductive cladding 203 is replaced by conductive cladding 205. Conductive cladding 205 contacts a portion of the vertical sidewalls of doped semiconductor line 202 and extends into a central portion of doped semiconductor line 202. The bottom of conductive cladding 205 contacts doped semiconductor line 202. In one embodiment, conductive cladding 205 contacts one vertical sidewall of doped semiconductor line 202 and not the other vertical sidewall of doped semiconductor line 202. It is noted that doped semiconductor lines 202 including conductive cladding 205 are buried in or embraced by a properly doped semiconductor to avoid inter-wiring leakage via the substrate. The doped region can consist of similar doping as silicon wire.

Figure 6:
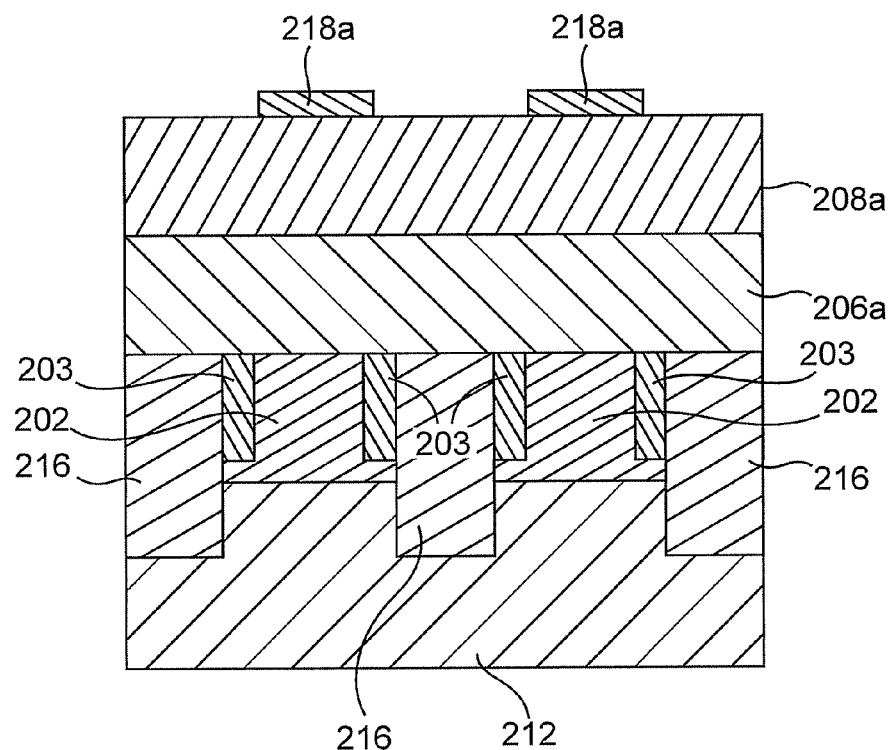
FIG. 6 illustrates a cross-sectional view of one embodiment of the substrate, the isolation regions, the doped semiconductor lines, the conductive cladding, an N− doped semiconductor layer, a P+ doped semiconductor layer, and a hard mask material layer.
Figure 61:
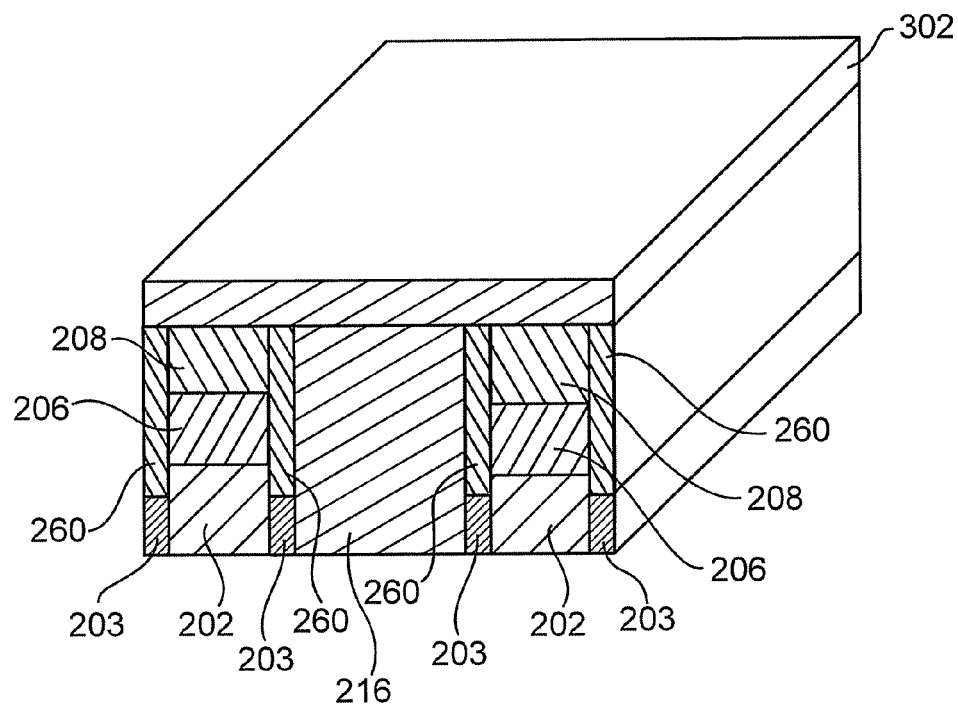
FIG. 61 illustrates a perspective view of one embodiment of the doped semiconductor lines, the dielectric material, the conductive cladding, the diodes, and STI fill material.

The following FIGS. 6-61 illustrate embodiments for fabricating diodes 109 and doped semiconductor lines 202 including conductive cladding, such as conductive cladding 203, 204, or 205. While the illustrated embodiments are focused on using a bulk silicon wafer, the embodiments can also be adapted for using silicon on insulator (SOI) wafers or other suitable substrates. The following FIGS. 6-9 illustrate embodiments for fabricating diodes 109 over doped semiconductor lines 202 including conductive cladding 203 as previously described and illustrated with reference to FIG. 3A.

FIG. 6 illustrates a cross-sectional view of one embodiment of substrate 212, isolation regions 216, doped semiconductor lines 202, conductive cladding 203, an N− doped semiconductor layer 206a, a P+ doped semiconductor layer 208a, and a hard mask material layer 218a. N− doped silicon is deposited over isolation regions 216, doped semiconductors lines 202, and conductive cladding 203 to provide N− doped semiconductor layer 206a. P+ doped silicon is deposited over N− doped semiconductor layer 206a to provide P+ doped semiconductor layer 208a. N− doped semiconductor layer 206a and P+ doped semiconductor layer 208a are deposited using an epitaxy process. In one embodiment, semiconductor layers 206a and 208a are doped after deposition to provide the desired doping profile.

A hard mask material, such as SiN or another suitable material is deposited over doped semiconductor layer 208a to provide a hard mask material layer. The hard mask material layer is deposited using chemical vapor deposition (CVD), high density plasma-chemical vapor deposition (HDP-CVD), atomic layer deposition (ALD), metal organic chemical vapor deposition (MOCVD), physical vapor deposition (PVD), jet vapor deposition (JVP), or other suitable deposition technique. The hard mask material layer is then patterned using a photolithography process or another suitable process and etched to expose portions of doped semiconductor layer 208a to provide hard mask material layer 218a. In one embodiment, hard mask material layer 218a includes contact-like portions of hard mask material.

Figure 7:
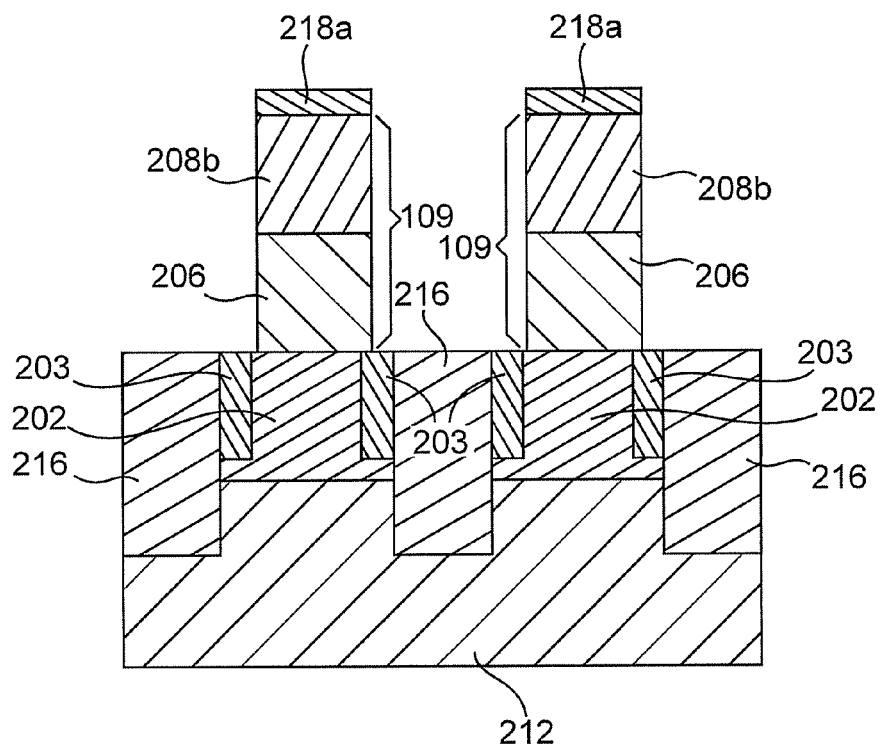
FIG. 7 illustrates a cross-sectional view of one embodiment of the substrate, the isolation regions, the doped semiconductor lines, the conductive cladding, diodes, and the hard mask material layer after etching the P+ doped semiconductor layer and the N− doped semiconductor layer.

FIG. 7 illustrates a cross-sectional view of one embodiment of substrate 212, isolation regions 216, doped semiconductor lines 202, conductive cladding 203, diodes 109, and hard mask material layer 218a after etching P+ doped semiconductor layer 208a and N− doped semiconductor layer 206a. The exposed portions of doped semiconductor layer 208a and the underlying portions of doped semiconductor layer 206a are etched to expose isolation regions 216, conductive cladding 203, and portions of doped semiconductor lines 202, to provide diodes 109 including doped regions 206 and 208b. Doped regions 206 and 208b are then cleaned and oxidized without damaging conductive cladding 203. In one embodiment, doped semiconductor layers 208a and 206a are etched using a two-step etch in combination with a protective oxide spacer around doped regions 206 and 208b to prevent damage to covered conductive cladding 203.

Figure 8:
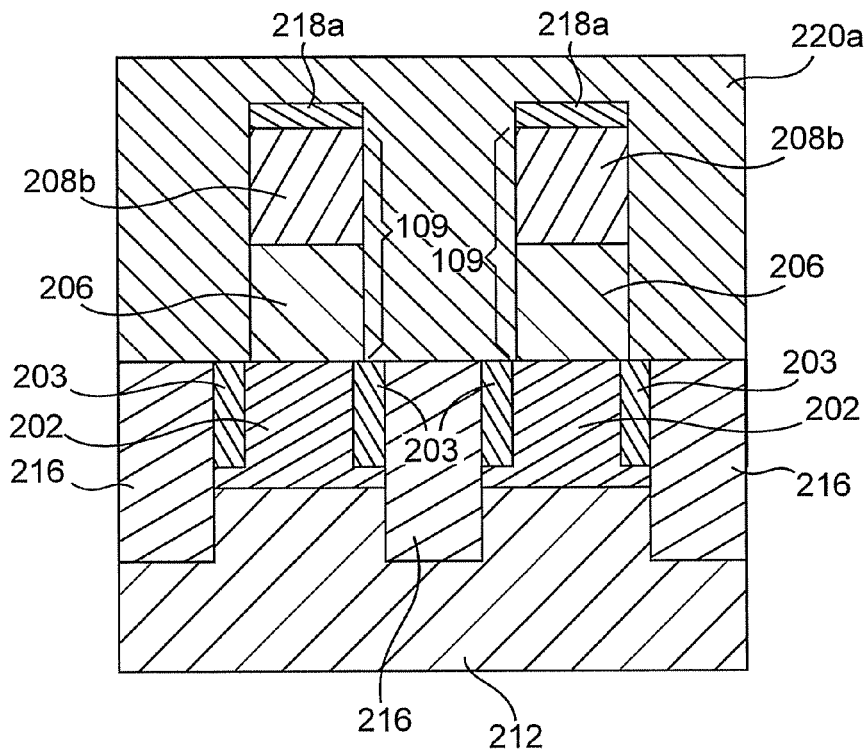
FIG. 8 illustrates a cross-sectional view of one embodiment of the substrate, the isolation regions, the doped semiconductor lines, the conductive cladding, the diodes, the hard mask material layer, and a first dielectric material layer.

FIG. 8 illustrates a cross-sectional view of one embodiment of substrate 212, isolation regions 216, doped semiconductor lines 202, conductive cladding 203, diodes 109, hard mask material layer 218a, and a first dielectric material layer 220a. Exposed portions of doped regions 206 and 208b are subjected to a passivation process to oxidize the exposed surfaces of regions 206 and 208b. A dielectric material, such as $SiO_2$, fluorinated silica glass (FSG), boron-phosphorous silicate glass (BPSG), boron-silicate glass (BSG), or other suitable dielectric material is deposited over exposed portions of hard mask material layer 218a, doped regions 208b and 206, doped semiconductor lines 202, conductive cladding 203, and isolation material 216 to provide first dielectric material layer 220a. First dielectric material layer 220a is deposited using CVD, HDP-CVD, ALD, MOCVD, PVD, JVP, spin-on, or other suitable deposition technique. In one embodiment, first dielectric material layer 220a is planarized using chemical mechanical planarization (CMP) or another suitable planarization technique.

Figure 9:
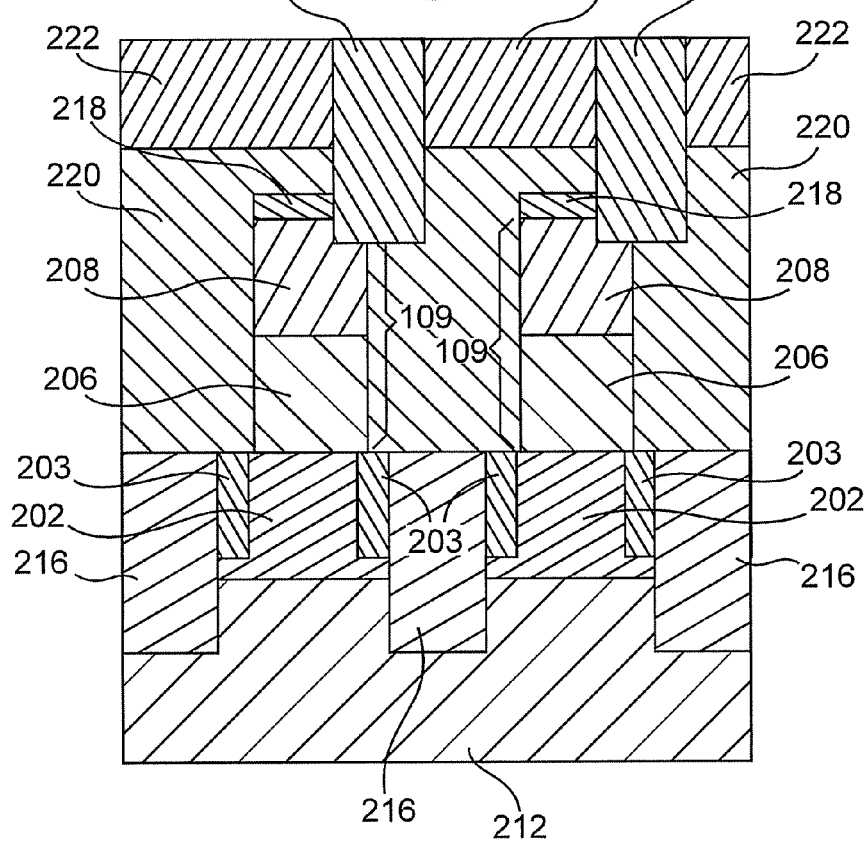
FIG. 9 illustrates a cross-sectional view of one embodiment of the substrate, the isolation regions, the doped semiconductor lines, the conductive cladding, the diodes, the hard mask material layer, the first dielectric material layer, a second dielectric material layer, and contacts.

FIG. 9 illustrates a cross-sectional view of one embodiment of substrate 212, isolation regions 216, doped semiconductor lines 202, conductive cladding 203, diodes 109, hard mask material layer 218, first dielectric material layer 220, a second dielectric material layer 222, and contacts 224. A dielectric material, such as $SiO_2$, FSG, BPSG, BSG, or other suitable dielectric material is deposited over first dielectric material layer 220a to provide a second dielectric material layer. Portions of the second dielectric material layer and underlying portions of first dielectric material layer 220a and hard mask material layer 218a are etched to provide openings exposing at least a portion of doped regions 208b and to provide second dielectric material layer 222, first dielectric material layer 220, and hard mask material layer 218.

A contact material, such as TiN, TaN, W, Al, Ti, Ta, TiSiN, TaSiN, TiAlN, TaAlN, Cu, WN, C, or another suitable contact material in deposited over second dielectric material layer 222 and into the openings to provide a contact material layer. The contact material layer is deposited using CVD, HDP-CVD, ALD, MOCVD, PVD, JVP, or other suitable deposition technique. The contact material layer is then planarized to expose second dielectric material layer 222 and to provide contacts 224. The contact material layer is planarized using CMP or another suitable planarization technique.

Figure 10:
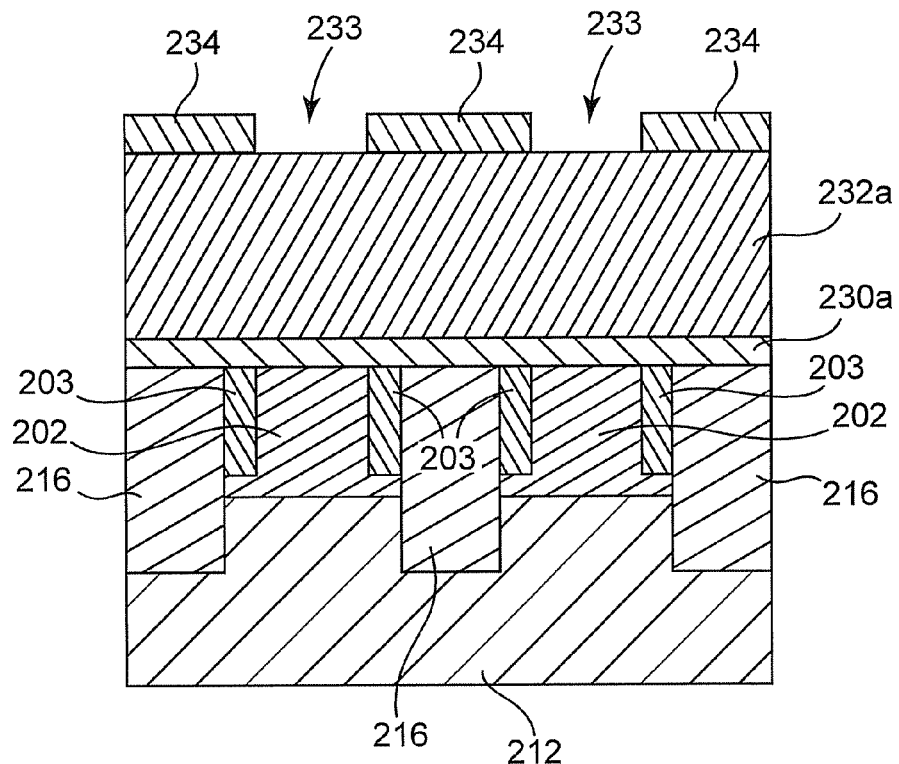
FIG. 10 illustrates a cross-sectional view of one embodiment of the substrate, the isolation regions, the doped semiconductor lines, the conductive cladding, an etch stop material layer, a dielectric material layer, and a mask.
Figure 11:
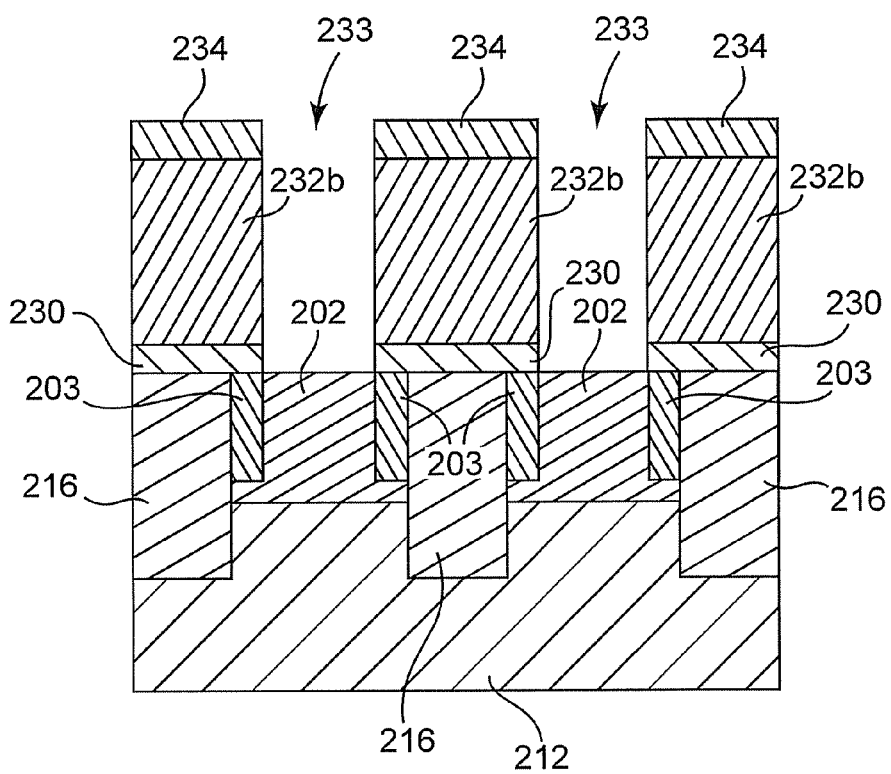
FIG. 11 illustrates a cross-sectional view of one embodiment of the substrate, the isolation regions, the doped semiconductor lines, the conductive cladding, the etch stop material layer, the dielectric material layer, and the mask after etching the dielectric material layer and the etch stop material layer.
Figure 12:
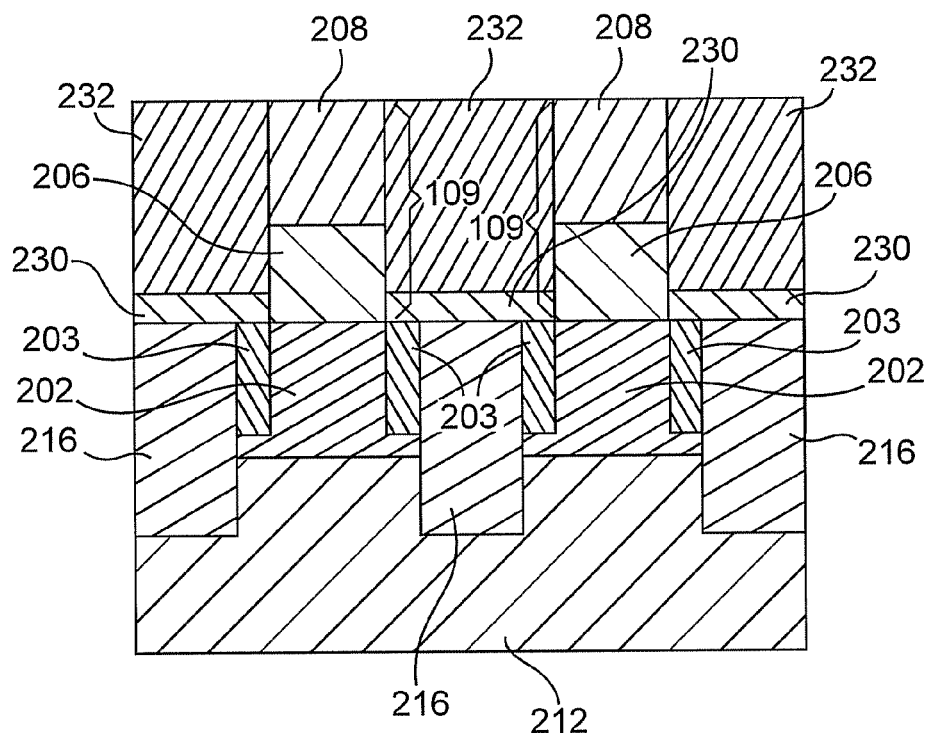
FIG. 12 illustrates a cross-sectional view of one embodiment of the substrate, the isolation regions, the doped semiconductor lines, the conductive cladding, the etch stop material layer, the dielectric material layer, and diodes.

The following FIGS. 10-12 illustrate embodiments for fabricating diodes 109 over doped semiconductor lines 202 including conductive cladding 203 as previously described and illustrated with reference to FIG. 3A.

FIG. 10 illustrates a cross-sectional view of one embodiment of substrate 212, isolation regions 216, doped semiconductor lines 202, conductive cladding 203, an etch stop material layer 230a, a dielectric material layer 232a, and a mask 234. An etch stop material, such as SiN or another suitable material is deposited over doped semiconductors lines 202, conductive cladding 203, and isolation material 216 to provide etch stop material layer 230a. Etch stop material layer 230a is deposited using CVD, HDP-CVD, ALD, MOCVD, PVD, JVP, or other suitable deposition technique.

A dielectric material, such as $SiO_2$ is deposited over etch stop material layer 230a to provide dielectric material layer 232a. The thickness of dielectric material layer 232a is greater than the thickness of etch stop material layer 230a. Dielectric material layer 232a is deposited using CVD, HDP-CVD, ALD, MOCVD, PVD, JVP, or other suitable deposition technique.

A mask material layer is deposited over dielectric material layer 232a. The mark material layer is deposited using CVD, HDP-CVD, ALD, MOCVD, PVD, JVP, spin-on, or other suitable deposition technique. The mask material layer is patterned to provide openings 233 exposing portions of dielectric material layer 232a and to provide mask 234. In one embodiment, openings 233 are contact-like openings.

FIG. 11 illustrates a cross-sectional view of one embodiment of substrate 212, isolation regions 216, doped semiconductor lines 202, conductive cladding 203, etch stop material layer 230, dielectric material layer 232b, and mask 234 after etching dielectric material layer 232a and etch stop material layer 230a. Exposed portions of dielectric material layer 232a are etched to expose portions of etch stop material layer 230a and to provide dielectric material layer 232b. The exposed portions of etch stop material layer 230a are then removed to expose portions of doped semiconductor lines 202 and to provide etch stop material layer 230.

FIG. 12 illustrates a cross-sectional view of one embodiment of substrate 212, isolation regions 216, doped semiconductor lines 202, conductive cladding 203, etch stop material layer 230, dielectric material layer 232, and diodes 109. N− doped silicon is deposited into opening 233 to provide doped regions 206. P+ doped silicon is deposited over doped regions 206 to provide doped regions 208 and diodes 109. In one embodiment, doped regions 206 and 208 are deposited using an epitaxy process. In one embodiment, doped regions 206 and 208 are doped after deposition to provide the desired doping profile. A process similar to the process previously described and illustrated with reference to FIG. 9 is then performed to fabricate contacts 224.

The following FIGS. 13-21 illustrate embodiments for fabricating diodes 109 and doped semiconductor lines 202 including conductive cladding 203 as previously described and illustrated with reference to FIG. 3A.

Figure 13:
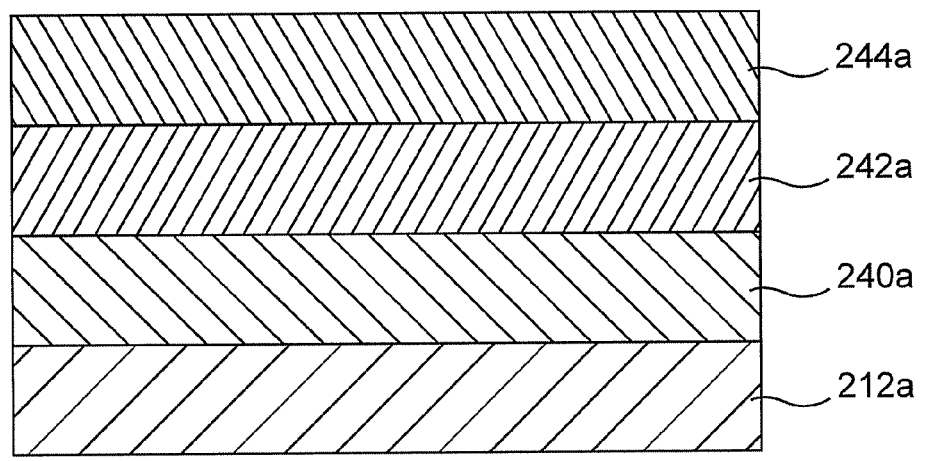
FIG. 13 illustrates a cross-sectional view of one embodiment of a doped semiconductor substrate.

FIG. 13 illustrates a cross-sectional view of one embodiment of a doped semiconductor substrate. A substrate is doped to provide doped regions 240a, 242a, and 244a, and an undoped region 212a. In one embodiment, a single crystal silicon substrate is doped to provide an N+ doped silicon region 240a, an N− doped silicon region 242a, a P+ doped silicon region 244a, and an undoped silicon region 212a. In another embodiment, doped regions 240a, 242a, and 244a are formed using an epitaxy process. In another embodiment, doped regions 240a, 242a, and 244a are formed using a combination of both an epitaxy process and a doping process. In another embodiment, region 244a is doped later in the fabrication process.

Figure 14:
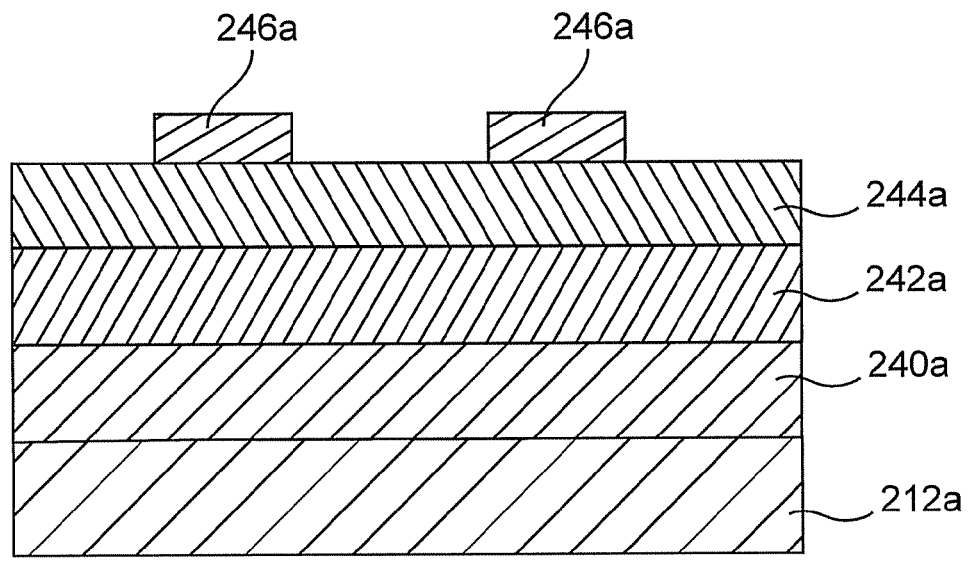
FIG. 14 illustrates a cross-sectional view of one embodiment of the doped semiconductor substrate and a hard mask material layer.

FIG. 14 illustrates a cross-sectional view of one embodiment of the doped semiconductor substrate and a hard mask material layer 246a. A hard mask material, such as SiN or another suitable material is deposited over doped region 244a to provide a hard mask material layer. The hard mask material layer is deposited using CVD, HDP-CVD, ALD, MOCVD, PVD, JVP, or other suitable deposition technique. The hard mask material layer is then patterned using a photolithography process or another suitable process and etched to expose portions of doped region 244a to provide hard mask material layer 246a. In one embodiment, hard mask material layer 246a includes lines of hard mask material.

Figure 15:
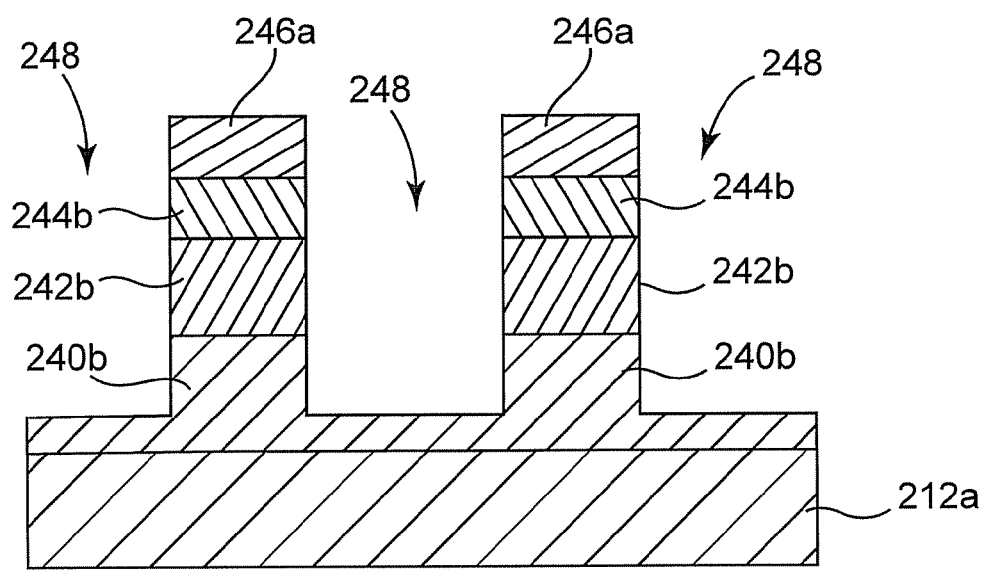
FIG. 15 illustrates a cross-sectional view of one embodiment of the substrate, the doped semiconductor region, the doped semiconductor lines, and the hard mask material layer after etching the doped semiconductor substrate.

FIG. 15 illustrates a cross-sectional view of one embodiment of substrate 212a, doped semiconductor region 240b, doped semiconductor lines 242b and 244b, and hard mask material layer 246a after etching the doped semiconductor substrate. The exposed portions of doped region 244a and underlying portions of doped regions 242a and 240a are etched to provide openings 248 and to provide doped region 240b and doped semiconductor lines 242b and 244b. In one embodiment, openings 248 are trenches. In one embodiment, the exposed portions of doped region 244a and the underlying portions of doped regions 242a and 240a are etched to provide openings 248 leaving semiconductor materials 240b over substrate 212a. In one embodiment, portions of substrate 212a below openings 248 are also etched. Substrate 212a is then doped to minimize leakage current between the doped semiconductor lines.

Figure 16:
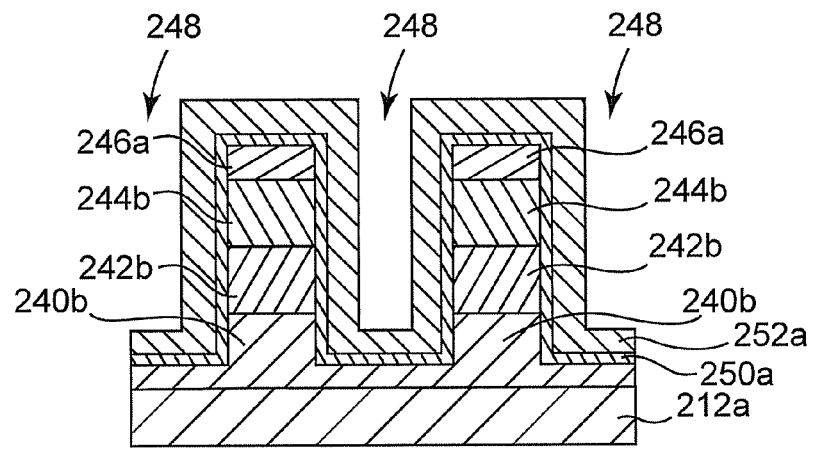
FIG. 16 illustrates a cross-sectional view of one embodiment of the substrate, the doped semiconductor region, the doped semiconductor lines, the hard mask material layer, a cladding material layer, and a dielectric material layer.

FIG. 16 illustrates a cross-sectional view of one embodiment of substrate 212a, doped semiconductor region 240b, doped semiconductor lines 242b and 244b, hard mask material layer 246a, a cladding material layer 250a, and a dielectric material layer 252a. A cladding material, such as C, TiN, or another suitable conductive material is deposited over exposed portions of hard mask material layer 246a, doped semiconductor lines 244b and 242b, and doped semiconductor region 240b to provide cladding material layer 250a. Cladding material layer 250a is deposited using CVD, HDP-CVD, ALD, MOCVD, PVD, JVP, or other suitable deposition technique.

A dielectric material, such as $SiO_2$, SiN, non-conducting amorphous carbon, or another suitable dielectric material is deposited over cladding material layer 250a to provide dielectric material layer 252a. Dielectric material layer 252a is deposited using CVD, HDP-CVD, ALD, MOCVD, PVD, JVP, or other suitable deposition technique.

Figure 17A:
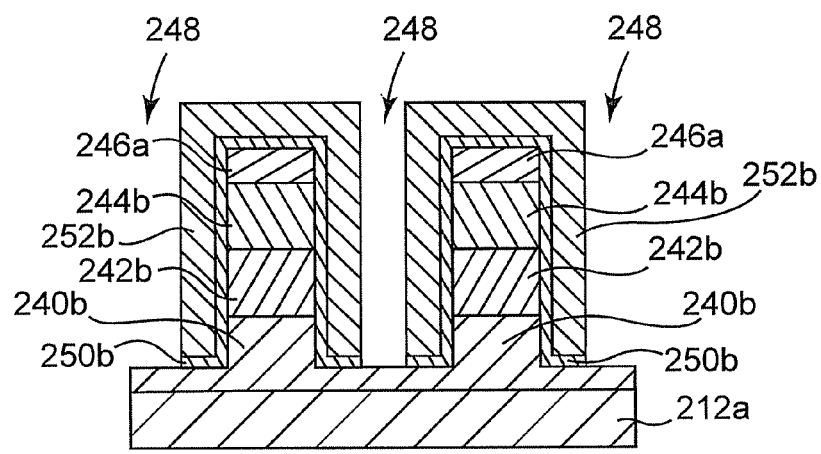
FIG. 17A illustrates a cross-sectional view of one embodiment of the substrate, the doped semiconductor region, the doped semiconductor lines, the hard mask material layer, the cladding material layer, and the dielectric material layer after etching the dielectric material layer and the cladding material layer.

FIG. 17A illustrates a cross-sectional view of one embodiment of substrate 212a, doped semiconductor lines 240b, 242b, and 244b, hard mask material layer 246a, cladding material layer 250b, and dielectric material layer 252b after etching dielectric material layer 252a and cladding material layer 250a. The portions of dielectric material layer 252a and cladding material layer 250a at the bottom of openings 248 are selectively etched to expose portions of doped semiconductor lines 240b and to provide dielectric material layer 252b and cladding material layer 250b.

Figure 17B:
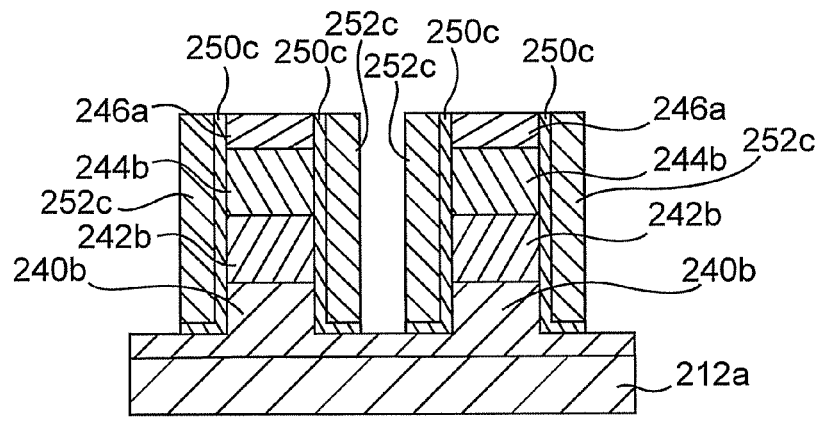
FIG. 17B illustrates a cross-sectional view of another embodiment of the substrate, the doped semiconductor region, the doped semiconductor lines, the hard mask material layer, the cladding material layer, and the dielectric material layer after etching the dielectric material layer and the cladding material layer.

FIG. 17B illustrates a cross-sectional view of another embodiment of substrate 212a, doped semiconductor region 240b, doped semiconductor lines 242b and 244b, hard mask material layer 246a, cladding material layer 250c, and dielectric material layer 252c after etching dielectric material layer 252a and cladding material layer 250a. In this embodiment, dielectric material layer 252a and cladding material layer 250a are spacer etched to expose hard mask material layer 246a and portions of doped semiconductor region 240b to provide dielectric material layer 252c and cladding material layer 250c. While the following FIGS. 18 and 19 include dielectric material layer 252c and cladding material layer 250c, dielectric material layer 252b and cladding material layer 250b illustrated with reference to FIG. 17A can be used in place of dielectric material layer 252c and cladding material layer 250c.

Figure 18:
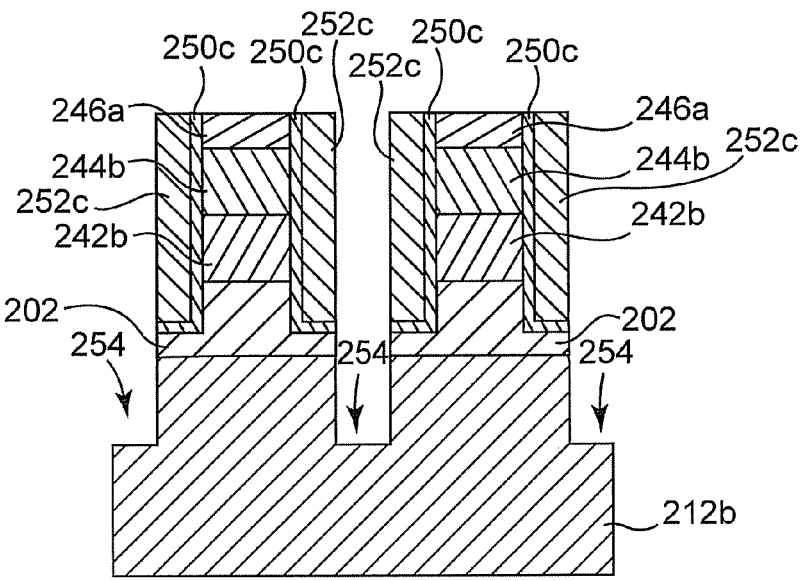
FIG. 18 illustrates a cross-sectional view of one embodiment of the substrate, the doped semiconductor lines, the hard mask material layer, the cladding material layer, and the dielectric material layer after etching portions of the doped semiconductor region and the substrate.

FIG. 18 illustrates a cross-sectional view of one embodiment of substrate 212b, doped semiconductor lines 202, 242b, and 244b, hard mask material layer 246a, cladding material layer 250c, and dielectric material layer 252c after etching portions of doped semiconductor region 240b and substrate 212a. The exposed portions of doped semiconductor region 240b and optionally the underlying portions of substrate 212a are etched to provide openings 254, doped semiconductor lines 202, and substrate 212b.

Figure 19:
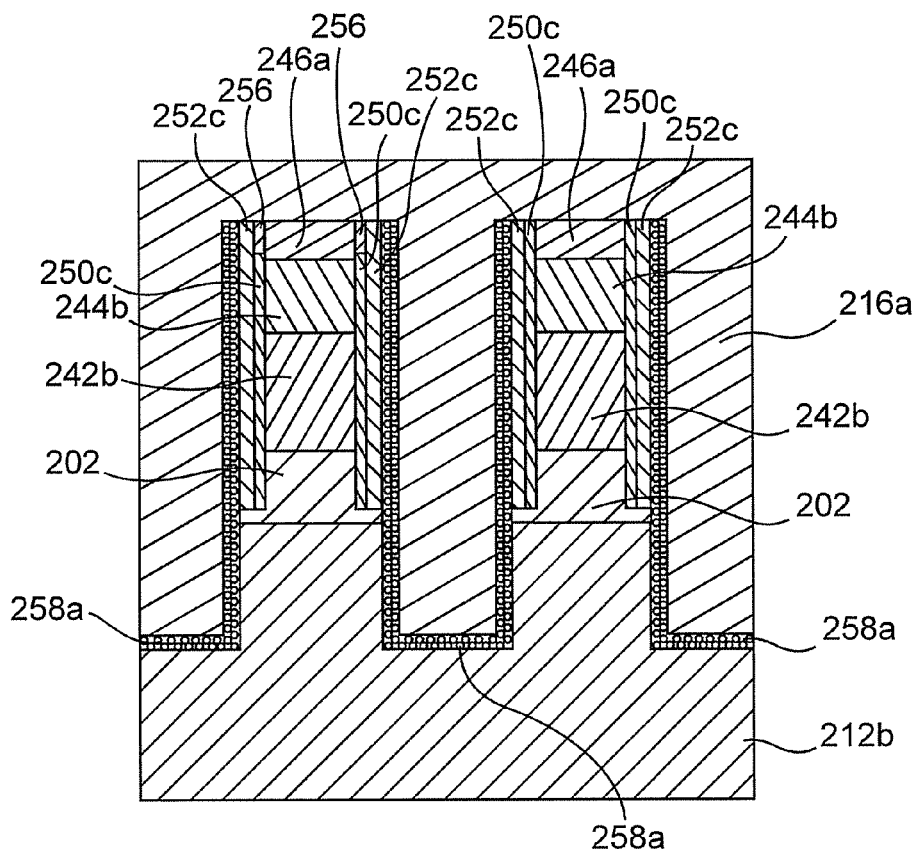
FIG. 19 illustrates a cross-sectional view of one embodiment of the substrate, the doped semiconductor lines, the hard mask material layer, the cladding material layer, the dielectric material layer, shallow trench isolation (STI) passivation material, and STI fill material.

FIG. 19 illustrates a cross-sectional view of one embodiment of substrate 212b, doped semiconductor lines 202, 242b, and 244b, hard mask material layer 246a, cladding material layer 250c, dielectric material layer 252c, STI passivation material 258a, and STI fill material 216a. Exposed portions of dielectric material layer 252c and substrate 212b are subjected to an STI passivation process to oxidize the exposed surfaces of dielectric material layer 252c and substrate 212b to provide STI passivation material 258a. In one embodiment, a portion of cladding material layer 250c as indicated at 256 may also be oxidized during the STI passivation process.

An STI fill material, such as SiO$_2$, FSG, BPSG, BSG, or other suitable dielectric material is deposited over exposed portions of hard mask material layer 246a, cladding material layer 250c, dielectric material layer 252c, and STI passivation material 258a to provide STI fill material 216a. STI fill material 216a is deposited using CVD, HDP-CVD, ALD, MOCVD, PVD, JVP, spin-on, or other suitable deposition technique.

Figure 20:
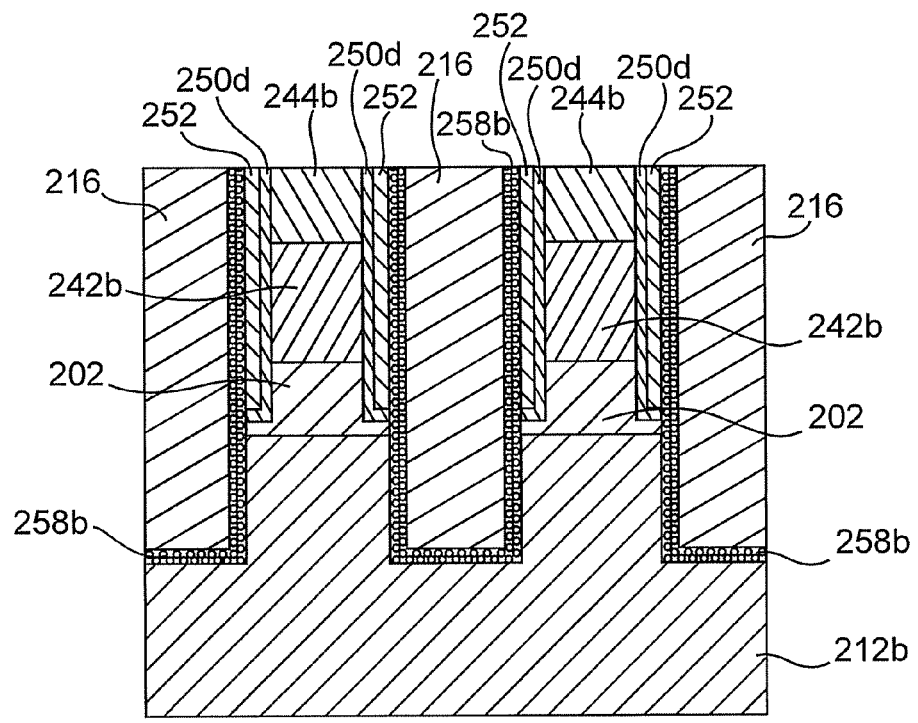
FIG. 20 illustrates a cross-sectional view of one embodiment of the substrate, the doped semiconductor lines, the cladding material layer, the dielectric material layer, the STI passivation material, and the STI fill material after planarization.

FIG. 20 illustrates a cross-sectional view of one embodiment of substrate 212b, doped semiconductor lines 202, 242b, and 244b, cladding material layer 250d, dielectric material 252, STI passivation material 258b, and STI fill material 216 after planarization. STI fill material 216a, hard mask material layer 246a, cladding material layer 250c, dielectric material layer 252c, and STI passivation material 258a are planarized to expose doped semiconductor lines 244b to provide cladding material layer 250d, dielectric material 252, STI passivation material 258b, and STI fill material 216. STI fill material 216a, hard mask material layer 246a, cladding material layer 250c, dielectric material layer 252c, and STI passivation material 258a are planarized using CMP or another suitable planarization technique.

Figure 21:
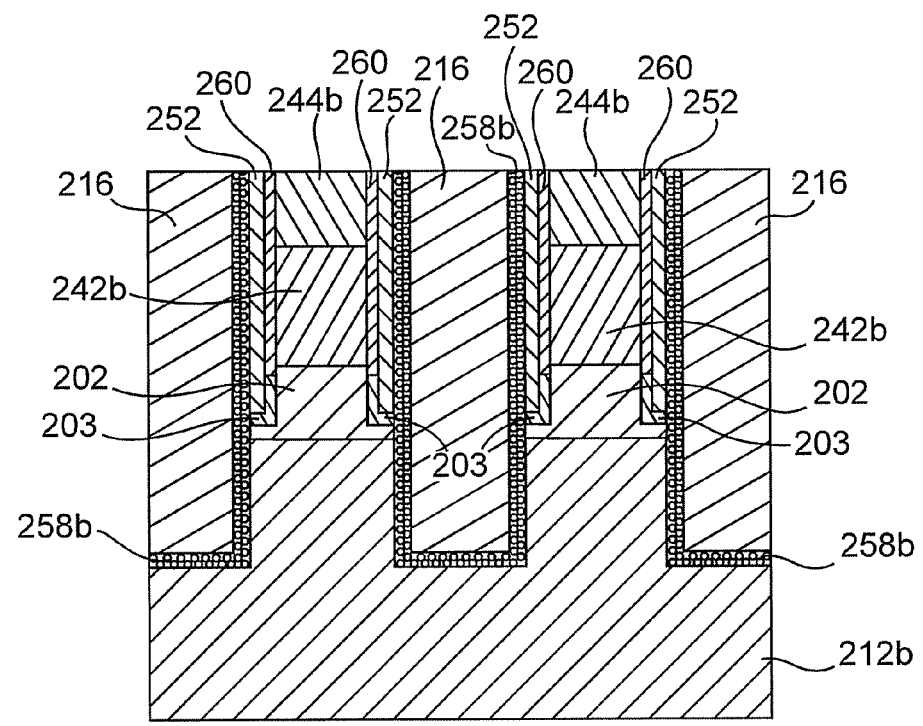
FIG. 21 illustrates a cross-sectional view of one embodiment of the substrate, the doped semiconductor lines, conductive cladding, the dielectric material layer, the STI passivation material, the STI fill material, and a dielectric material.

FIG. 21 illustrates a cross-sectional view of one embodiment of substrate 212b, doped semiconductor lines 202, 242b, and 244b, conductive cladding 203, dielectric material 252, STI passivation material 258b, STI fill material 216, and a dielectric material 260. Cladding material layer 250c is etched back to below doped semiconductor lines 242b to provide conductive cladding 203 as previously described and illustrated with reference to FIG. 3A.

A dielectric material, such as SiO$_2$ is deposited over conductive cladding 203, doped semiconductor line 244b, dielectric material 252, STI passivation material 258b, and STI fill material 216 to provide a dielectric material layer. The dielectric material layer is deposited using CVD, HDP-CVD, ALD, MOCVD, PVD, JVP, spin-on, or other suitable deposition technique. The dielectric material layer is then planarized to expose doped semiconductor line 244b and to provide dielectric material 260. The dielectric material layer is planarized using CMP or another suitable planarization technique.

The following FIGS. 22-29 illustrate embodiments for fabricating diodes 109 and doped semiconductor lines 202 including conductive cladding 203 as previously described and illustrated with reference to FIG. 3A. The fabrication process begins as previously described and illustrated with reference to FIGS. 13 and 14.

Figure 22:
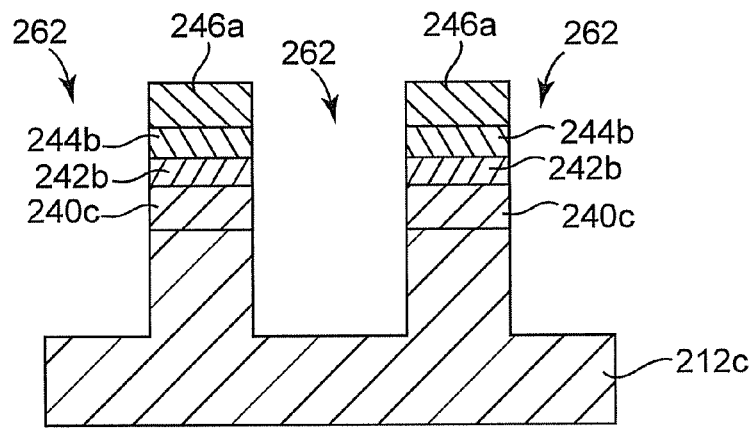
FIG. 22 illustrates a cross-sectional view of one embodiment of the substrate, doped semiconductor lines, and a hard mask material layer after etching the doped semiconductor substrate.

FIG. 22 illustrates a cross-sectional view of one embodiment of substrate 212c, doped semiconductor lines 240c, 242b, and 244b, and hard mask material layer 246a after etching the doped semiconductor substrate. The exposed portions of doped region 244a and the underlying portions of doped regions 242a and 240a and substrate 212a are etched to provide openings 262, doped semiconductor lines 240c, 242b, and 244b, and substrate 212c. In one embodiment, openings 262 are trenches.

Figure 23:
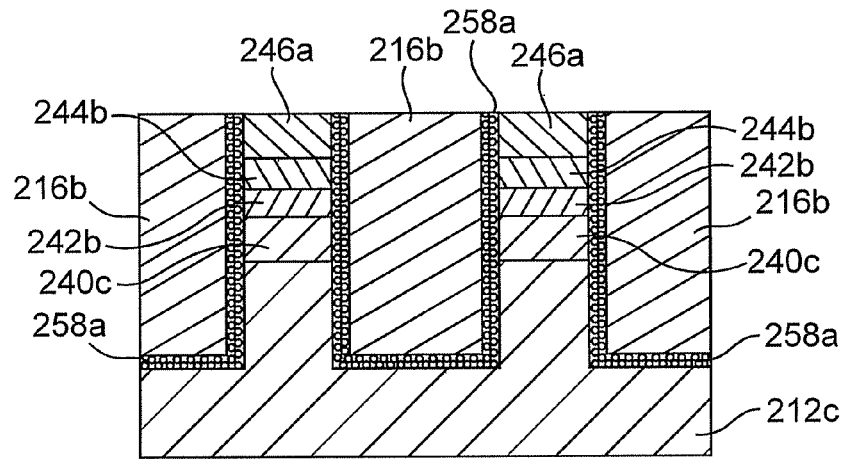
FIG. 23 illustrates a cross-sectional view of one embodiment of the substrate, the doped semiconductor lines, the hard mask material layer, STI passivation material, and STI fill material.

FIG. 23 illustrates a cross-sectional view of one embodiment of substrate 212c, doped semiconductor lines 240c, 242b, and 244b, hard mask material layer 246a, STI passivation material 258a, and STI fill material 216b. Exposed portions of hard mask material layer 246a, doped semiconductor lines 240c, and substrate 212c are subjected to an STI passivation process to oxidize the exposed surfaces of hard mask material layer 246a, doped semiconductor lines 240c, 242b, and 244b, and substrate 212c to provide STI passivation material.

An STI fill material, such as SiO$_2$, FSG, BPSG, BSG, or other suitable dielectric material is deposited over the STI passivation material. The STI fill material is deposited using CVD, HDP-CVD, ALD, MOCVD, PVD, JVP, spin-on, or other suitable deposition technique. The STI fill material and the STI passivation material is then planarized to expose hard mask material layer 246a to provide STI passivation material 258a and STI fill material 216b. The STI fill material and the STI passivation material are planarized using CMP or another suitable planarization technique.

Figure 24:
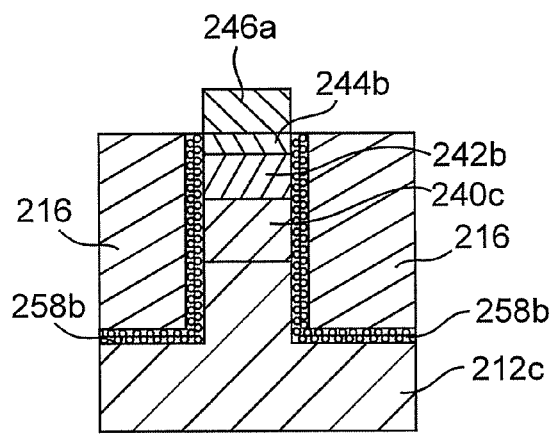
FIG. 24 illustrates a cross-sectional view of one embodiment of the substrate, the doped semiconductor lines, the hard mask material layer, the STI passivation material, and the STI fill material after etching the STI passivation material and the STI fill material.

FIG. 24 illustrates a cross-sectional view of one embodiment of substrate 212c, doped semiconductor lines 240c, 242b, and 244b, hard mask material layer 246a, STI passivation material 258b, and STI fill material 216 after etching STI passivation material 258a and STI fill material 216b. STI passivation material 258a and STI fill material 216b are etched using CMP dishing, an HF dip, a selective etch, or another suitable technique to expose the sidewalls of hard mask material layer 246a to provide STI passivation material 258b and STI fill material 216.

Figure 25:
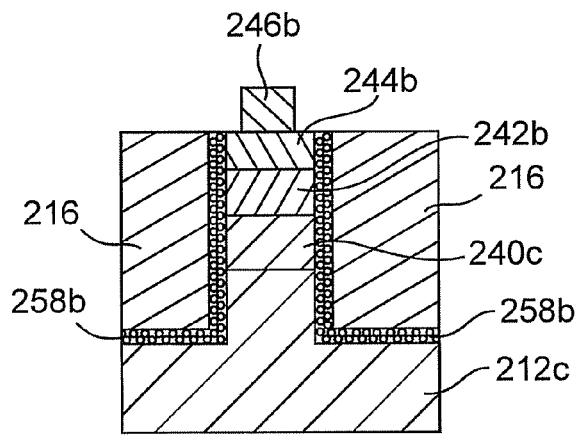
FIG. 25 illustrates a cross-sectional view of one embodiment of the substrate, the doped semiconductor lines, the hard mask material layer, the STI passivation material, and the STI fill material after etching the hard mask material layer.

FIG. 25 illustrates a cross-sectional view of one embodiment of substrate 212c, doped semiconductor lines 240c, 242b, and 244b, hard mask material layer 246b, STI passivation material 258b, and STI fill material 216 after etching hard mask material layer 246a. Hard mask material layer 246a is etched using a recess etch or another suitable technique to expose portions of doped semiconductor lines 244b.

Figure 26:
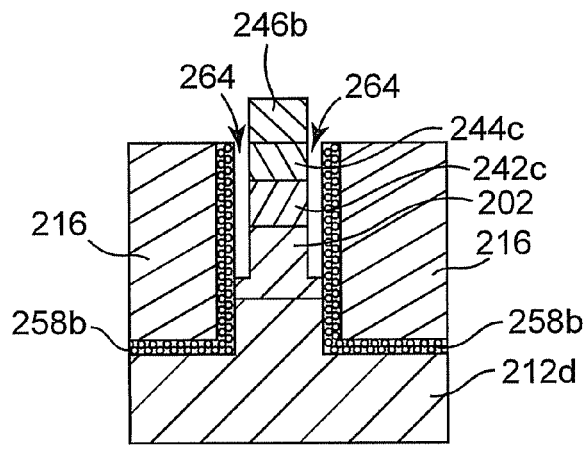
FIG. 26 illustrates a cross-sectional view of one embodiment of the substrate, the doped semiconductor lines, the hard mask material layer, the STI passivation material, and the STI fill material after etching the doped semiconductor lines.

FIG. 26 illustrates a cross-sectional view of one embodiment of substrate 212d, doped semiconductor lines 202, 242c, and 244c, hard mask material layer 246b, STI passivation material 258b, and STI fill material 216 after etching doped semiconductor lines 244b, 242b, and 240c. The exposed portions of doped semiconductor lines 244b and the underlying portions of doped semiconductor lines 242b and 240c and optionally the underlying portions of substrate 212c are selectively etched to a desired depth to provide openings 264, doped semiconductor lines 202, 242c, and 244c, and optionally substrate 212d.

Figure 27:
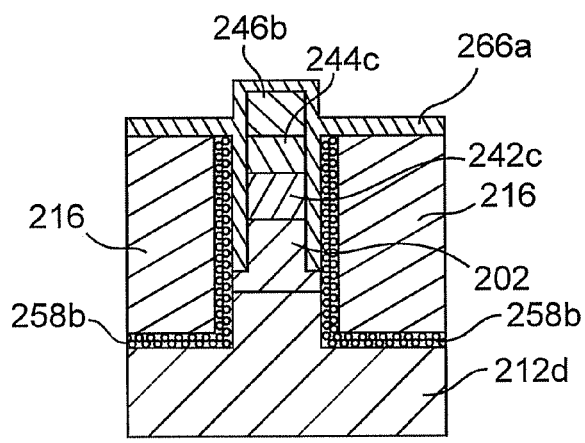
FIG. 27 illustrates a cross-sectional view of one embodiment of the substrate, the doped semiconductor lines, the hard mask material layer, the STI passivation material, the STI fill material, and a cladding material.

FIG. 27 illustrates a cross-sectional view of one embodiment of substrate 212d, doped semiconductor lines 202, 242c, and 244c, hard mask material layer 246b, STI passivation material 258b, STI fill material 216, and a cladding material 266a. A cladding material, such as C, TiN, or another suitable conductive material is deposited over exposed portions of hard mask material layer 246b, doped semiconductor lines 202, 242c, and 244c, STI passivation material 258b, and STI fill material 216 to provide cladding material 266a. Cladding material 266a is deposited using CVD, HDP-CVD, ALD, MOCVD, PVD, JVP, or other suitable deposition technique.

Figure 28:
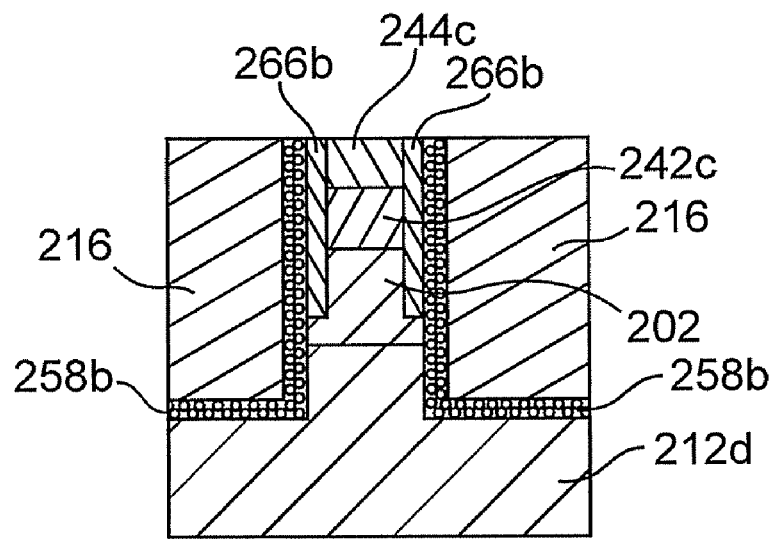
FIG. 28 illustrates a cross-sectional view of one embodiment of the substrate, the doped semiconductor lines, the STI passivation material, the STI fill material, and the cladding material after planarization.

FIG. 28 illustrates a cross-sectional view of one embodiment of substrate 212d, doped semiconductor lines 202, 242c, and 244c, STI passivation material 258b, STI fill material 216, and cladding material 266b after planarization. Cladding material 266a and hard mask material layer 246b are planarized to expose doped semiconductor line 244c and STI fill material 216 to provide cladding material 266b. Cladding material 266a and hard mask material layer 246b are planarized using CMP or another suitable planarization technique.

Figure 29:
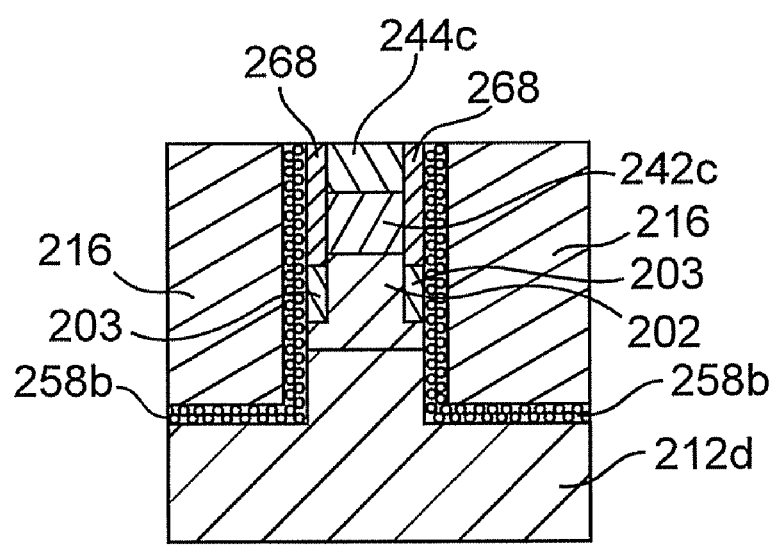
FIG. 29 illustrates a cross-sectional view of one embodiment of the substrate, the doped semiconductor lines, the STI passivation material, the STI fill material, conductive cladding, and a dielectric material.

FIG. 29 illustrates a cross-sectional view of one embodiment of substrate 212d, doped semiconductor lines 202, 242c, and 244c, STI passivation material 258b, STI fill material

216, conductive cladding 203, and a dielectric material 268. Cladding material 266b is etched back to below doped semiconductor lines 242c to provide conductive cladding 203 as previously described and illustrated with reference to FIG. 3A.

A dielectric material, such as SiO$_2$ is deposited over conductive cladding 203, doped semiconductor line 244c, STI passivation material 258b, and STI fill material 216 to provide a dielectric material layer. The dielectric material layer is deposited using CVD, HDP-CVD, ALD, MOCVD, PVD, JVP, spin-on, or other suitable deposition technique. The dielectric material layer is then planarized to expose doped semiconductor line 244c and to provide dielectric material 268. The dielectric material layer is planarized using CMP or another suitable planarization technique.

The following FIGS. 30A-34 illustrate embodiments for fabricating doped semiconductor lines 202 including conductive cladding 205 as previously described and illustrated with reference to FIG. 5. The fabrication process begins as previously described and illustrated with reference to FIGS. 13, 14, 22, and 23.

Figure 30A:
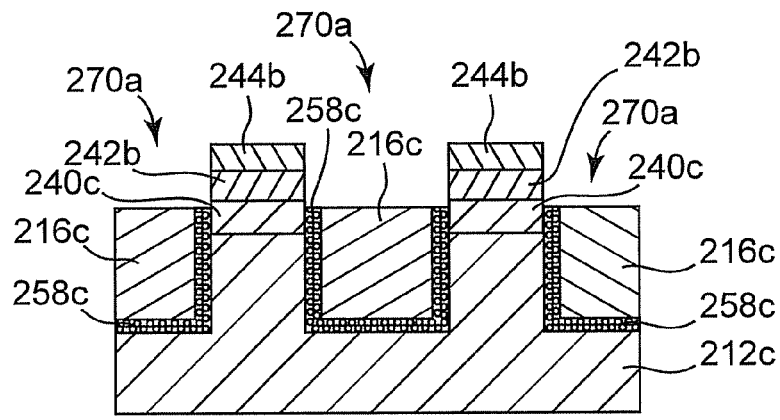
FIG. 30A illustrates a cross-sectional view of one embodiment of the substrate, the doped semiconductor lines, the STI passivation material, and the STI fill material after etching the STI passivation material and the STI fill material.

FIG. 30A illustrates a cross-sectional view of one embodiment of substrate 212c, doped semiconductor lines 240c, 242b, and 244b, STI passivation material 258c, and STI fill material 216c after etching STI passivation material 258b and STI fill material 216b. STI passivation material 258a and STI fill material 216b are etched to a desired depth to provide openings 270a, STI passivation material 258c, and STI fill material 216c. In one embodiment, openings 270a expose a portion of the sidewalls of doped semiconductor lines 240c. Hard mask material layer 246a is removed to expose the tops of doped semiconductor lines 244b.

Figure 30B:
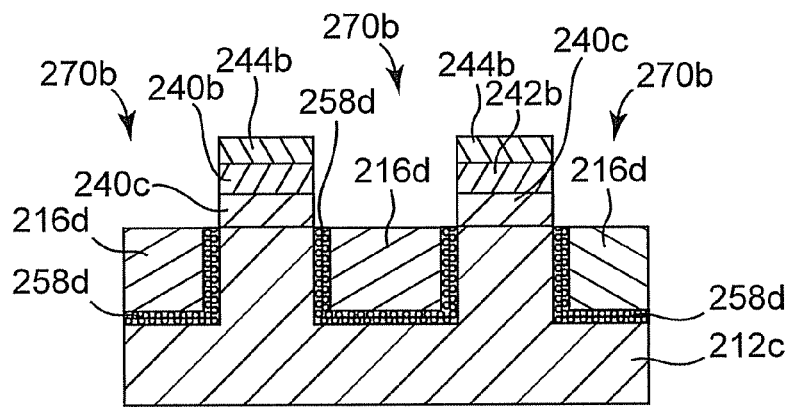
FIG. 30B illustrates a cross-sectional view of another embodiment of the substrate, the doped semiconductor lines, the STI passivation material, and the STI fill material after etching the STI passivation material and the STI fill material.

FIG. 30B illustrates a cross-sectional view of another embodiment of substrate 212c, doped semiconductor lines 240c, 242b, and 244b, STI passivation material 258d, and STI fill material 216d after etching STI passivation material 258b and STI fill material 216b. STI passivation material 258a and STI fill material 216b are etched to a desired depth to provide openings 270b, STI passivation material 258d, and STI fill material 216d. In one embodiment, openings 270b expose the sidewalls of doped semiconductor lines 240c. Hard mask material layer 246a is removed to expose the tops of doped semiconductor lines 244b.

Figure 30C:
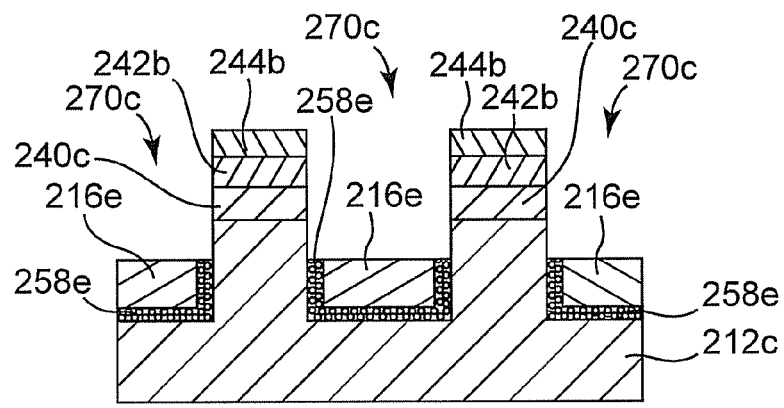
FIG. 30C illustrates a cross-sectional view of another embodiment of the substrate, the doped semiconductor lines, the STI passivation material, and the STI fill material after etching the STI passivation material and the STI fill material.

FIG. 30C illustrates a cross-sectional view of another embodiment of substrate 212c, doped semiconductor lines 240c, 242b, and 244b, STI passivation material 258e, and STI fill material 216e after etching STI passivation material 258b and STI fill material 216b. STI passivation material 258a and STI fill material 216b are etched to a desired depth to provide openings 270c, STI passivation material 258e, and STI fill material 216e. In one embodiment, openings 270c expose the sidewalls of doped semiconductor lines 240c and portions of the sidewalls of substrate 212c. Hard mask material layer 246a is removed to expose the tops of doped semiconductor lines 244b.

The depth of openings 270a (FIG. 30A), 270b (FIG. 30B), and 270c (FIG. 30C) are selected based on process and performance optimization and/or based on the doping profile of doped semiconductor lines 240c. Direct contact of a cladding line with substrate 212c may result in an undesired leakage current between neighboring doped semiconductor lines 240c. Therefore, substrate 212c is properly doped to minimize leakage currents. For example, for a p-doped substrate 212, the cladding lines may be surrounded by n-doped regions.

While the following FIGS. 31 and 32 include STI passivation material 258c and STI fill material 216c as illustrated with reference to FIG. 30A, STI passivation material 258d and STI fill material 216d as illustrated with reference to FIG. 30B or STI passivation material 258e and STI fill material 216e as illustrated with reference to FIG. 30C can be used in place of STI passivation material 258c and STI fill material 216c.

Figure 31:
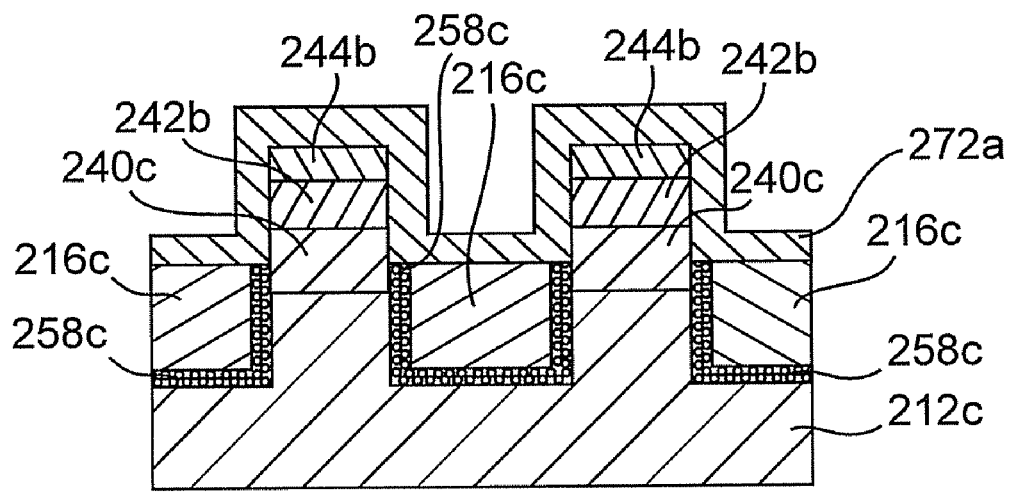
FIG. 31 illustrates a cross-sectional view of one embodiment of the substrate, the doped semiconductor lines, the STI passivation material, the STI fill material, and a spacer material layer.

FIG. 31 illustrates a cross-sectional view of one embodiment of substrate 212c, doped semiconductor lines 240c, 242b, and 244b, STI passivation material 258c, STI fill material 216c, and a spacer material layer 272a. A spacer material, such as SiN or another suitable spacer material is deposited over exposed portions of doped semiconductor lines 240c, 242b, and 244b, STI passivation material 258c, and STI fill material 216c to provide spacer material layer 272a. Spacer material layer 272a is deposited using CVD, HDP-CVD, ALD, MOCVD, PVD, JVP, or other suitable deposition technique.

Figure 32:
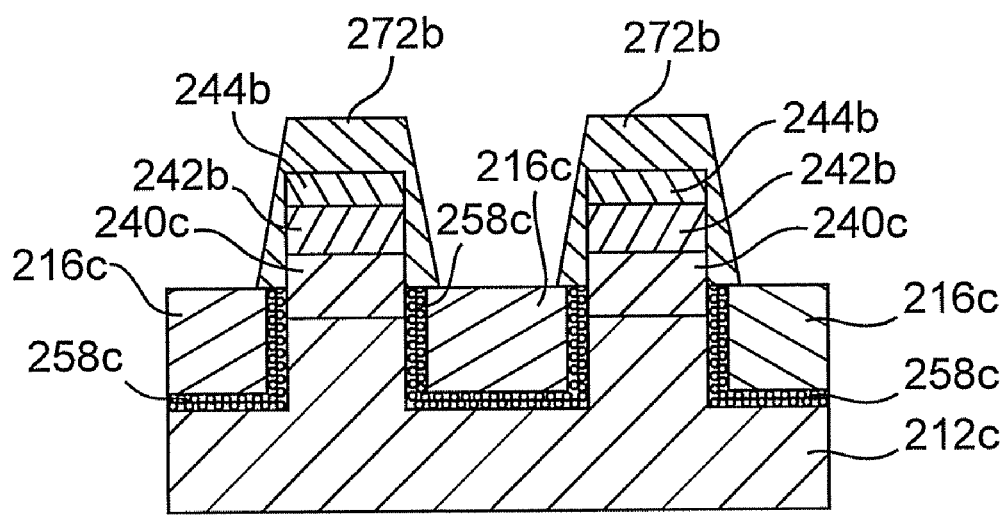
FIG. 32 illustrates a cross-sectional view of one embodiment of the substrate, the doped semiconductor lines, the STI passivation material, the STI fill material, and the spacer material layer after etching the spacer material layer.

FIG. 32 illustrates a cross-sectional view of one embodiment of substrate 212c, doped semiconductor lines 240c, 242b, and 244b, STI passivation material 258c, STI fill material 216c, and spacer material layer 272b after etching spacer material layer 272a. Spacer material layer 272a is etched to expose portions of STI fill material 216c and to provide spacer material layer 272b.

Figure 33:
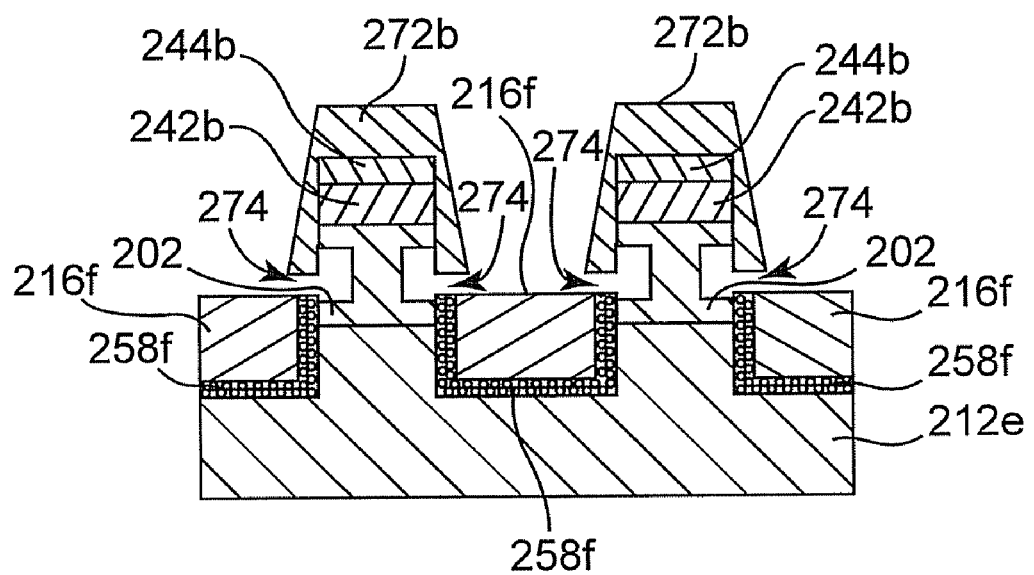
FIG. 33 illustrates a cross-sectional view of one embodiment of the substrate, the doped semiconductor lines, the STI passivation material, the STI fill material, and the spacer material layer after etching the STI passivation material, the STI fill material, the doped semiconductor lines, and the substrate.

FIG. 33 illustrates a cross-sectional view of one embodiment of substrate 212e, doped semiconductor lines 202, 242b, and 244b, STI passivation material 258f, STI fill material 216f, and spacer material layer 272b after etching STI passivation material 258c, STI fill material 216c, doped semiconductor lines 240c, and optionally substrate 212c. STI passivation material 258c and STI fill material 216c are etched to expose portions of doped semiconductor lines 240c to provide STI passivation material 258f and STI fill material 216f. The exposed portions of doped semiconductor lines 240c and the optionally adjacent portions of substrate 212c are then selectively etched to provide openings 274 and doped semiconductor lines 202 and optionally substrate 212e.

Figure 34:
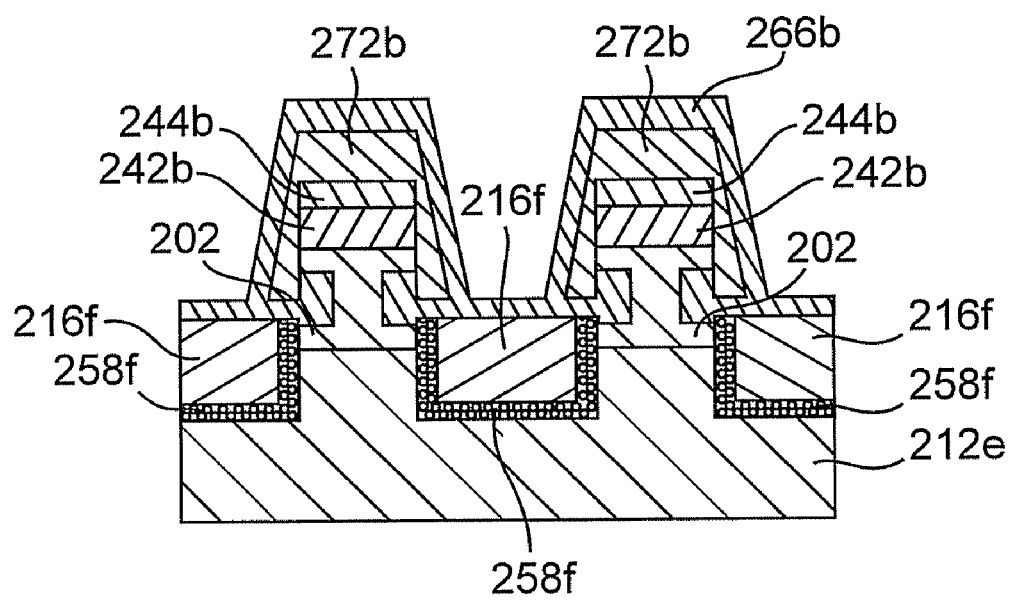
FIG. 34 illustrates a cross-sectional view of one embodiment of the substrate, the doped semiconductor lines, the STI passivation material, the STI fill material, the spacer material layer, and a cladding material.

FIG. 34 illustrates a cross-sectional view of one embodiment of substrate 212e, doped semiconductor lines 202, 242b and 244b, STI passivation material 258f, STI fill material 216f, spacer material layer 272b, and a cladding material 266b. A cladding material, such as C, TiN, or another suitable conductive material is deposited over exposed portions of spacer material layer 272b, doped semiconductor lines 202, STI passivation material 258f, STI fill material 216f, and substrate 212e to provide cladding material 266b. Cladding material 266b is deposited using CVD, HDP-CVD, ALD, MOCVD, PVD, JVP, or other suitable deposition technique.

Cladding material 266b is etched to expose STI fill material 216f. The fabrication process then continues as previously described and illustrated with reference to FIGS. 19 and 20 to provide doped semiconductor lines 202 including conductive cladding 205 previously described and illustrated with reference to FIG. 5.

The following FIGS. 35-41 illustrate embodiments for fabricating doped semiconductor lines 202 including conductive cladding 203 as previously described and illustrated with reference to FIG. 3A. The fabrication process begins as previously described and illustrated with reference to FIGS. 13, 14, and 22.

Figure 35:
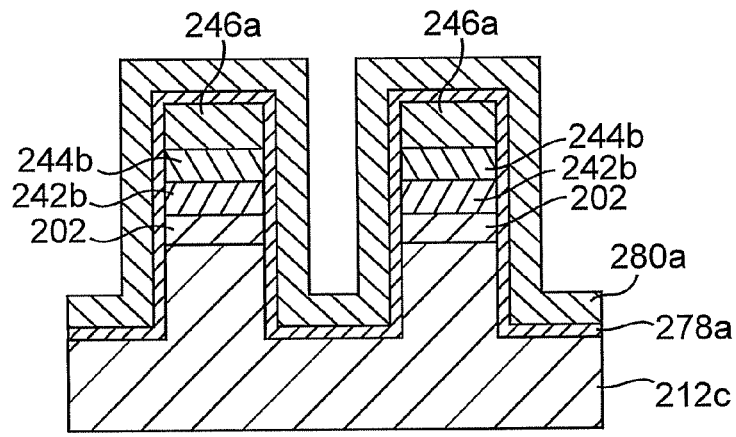
FIG. 35 illustrates a cross-sectional view of one embodiment of the substrate, the doped semiconductor lines, the hard mask material layer, a sacrificial material layer, and a spacer material layer.

FIG. 35 illustrates a cross-sectional view of one embodiment of substrate 212c, doped semiconductor lines 202, 242b, and 244b, hard mask material layer 246a, a sacrificial material layer 278a, and a spacer material layer 280a. A sacrificial material, such as SiO$_2$ or another suitable material is deposited over exposed portions of hard mask material layer 246a, doped semiconductor lines 202, 242b, and 244b, and substrate 212c to provide sacrificial material layer 278a. Sacrificial material layer 278a is deposited using CVD, HDP-CVD, ALD, MOCVD, PVD, JVP, or other suitable deposition technique.

A spacer material, such as SiN or another suitable spacer material is deposited over sacrificial material layer 278a to provide spacer material layer 280a. Spacer material layer 280a is deposited using CVD, HDP-CVD, ALD, MOCVD, PVD, JVP, or other suitable deposition technique.

Figure 36:
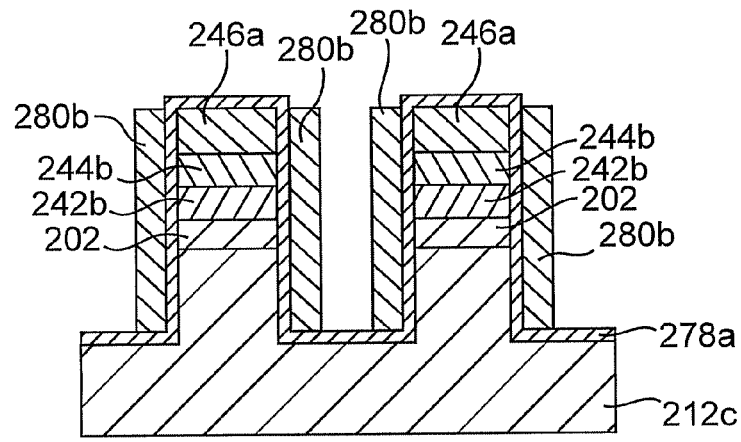
FIG. 36 illustrates a cross-sectional view of one embodiment of the substrate, the doped semiconductor lines, the hard mask material layer, the sacrificial material layer, and spacers after etching the spacer material layer.

FIG. 36 illustrates a cross-sectional view of one embodiment of substrate 212c, doped semiconductor lines 202, 242b, and 244b, hard mask material layer 246a, sacrificial material layer 278a, and spacers 280b after etching spacer material layer 280a. Spacer material layer 280a is spacer etched to expose portions of sacrificial material layer 278a to provide spacers 280b.

Figure 37:
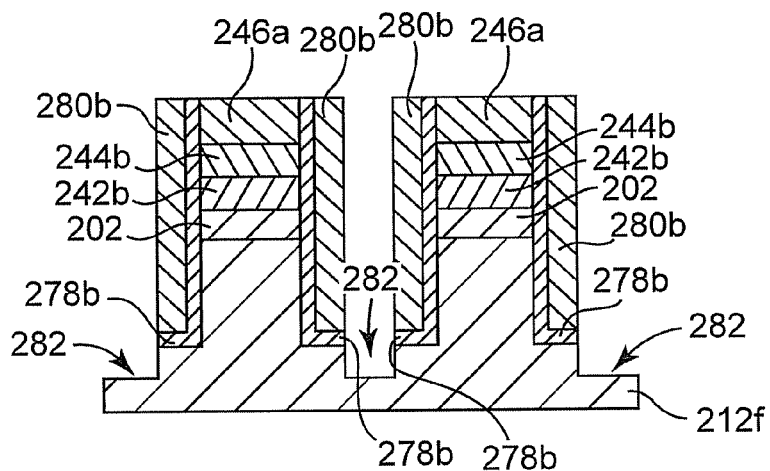
FIG. 37 illustrates a cross-sectional view of one embodiment of the substrate, the doped semiconductor lines, the hard mask material layer, the sacrificial material layer, and the spacers after etching the sacrificial material layer and the substrate.

FIG. 37 illustrates a cross-sectional view of one embodiment of substrate 212f, doped semiconductor lines 202, 242b, and 244b, hard mask material layer 246a, sacrificial material layer 278b, and spacers 280b after etching sacrificial material layer 278a and substrate 212c. The exposed horizontal portions of sacrificial material layer 278a are etched to expose hard mask material layer 246a and substrate 212c to provide sacrificial material layer 278b. The exposed portions of substrate 212c are optionally etched to provide openings 282 and substrate 212f.

Figure 38:
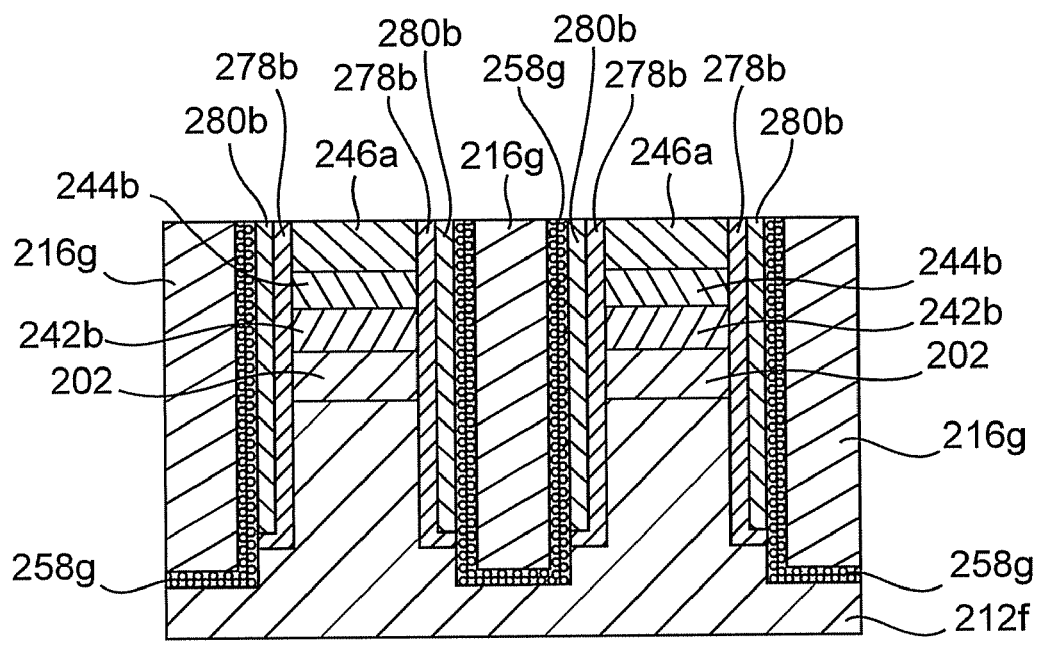
FIG. 38 illustrates a cross-sectional view of one embodiment of the substrate, the doped semiconductor lines, the hard mask material layer, the sacrificial material layer, the spacers, STI passivation material, and STI fill material.

FIG. 38 illustrates a cross-sectional view of one embodiment of substrate 212f, doped semiconductor lines 202, 242b, and 244b, hard mask material layer 246a, sacrificial material layer 278b, spacers 280b, STI passivation material 258g, and STI fill material 216g. Exposed portions of sacrificial material layer 278b, spacers 280b, and substrate 212f are subjected to an STI passivation process to oxidize the exposed surfaces of sacrificial material layer 278b, spacers 280b, and substrate 212f to provide STI passivation material.

An STI fill material, such as $SiO_2$, FSG, BPSG, BSG, or other suitable dielectric material is deposited over the STI passivation material. The STI fill material is deposited using CVD, HDP-CVD, ALD, MOCVD, PVD, JVP, spin-on, or other suitable deposition technique. The STI fill material and the STI passivation material is then planarized to expose hard mask material layer 246a to provide STI passivation material 258g and STI fill material 216g. The STI fill material and the STI passivation material are planarized using CMP or another suitable planarization technique.

Figure 39:
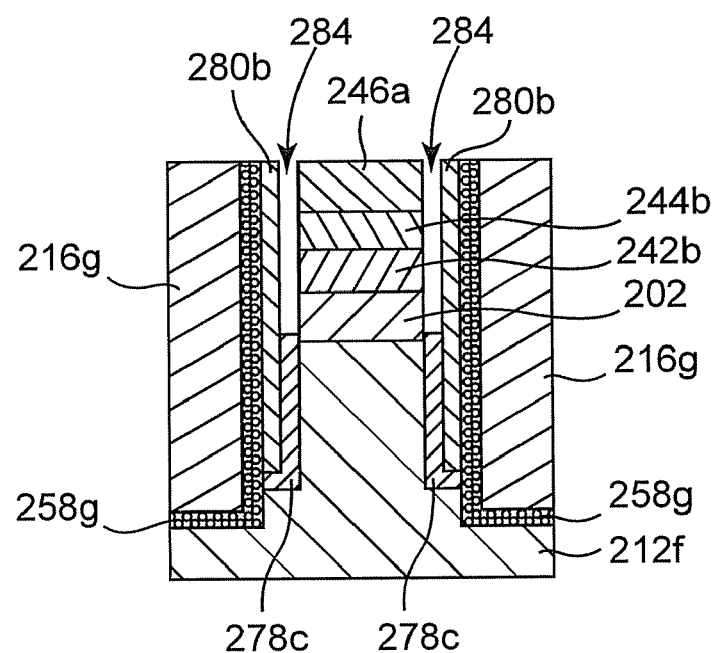
FIG. 39 illustrates a cross-sectional view of one embodiment of the substrate, the doped semiconductor lines, the hard mask material layer, the sacrificial material layer, the spacers, the STI passivation material, and the STI fill material after etching the sacrificial material layer.

FIG. 39 illustrates a cross-sectional view of one embodiment of substrate 212f, doped semiconductor lines 202, 242b, and 244b, hard mask material layer 246a, sacrificial material layer 278c, spacers 280b, STI passivation material 258g, and STI fill material 216g after etching sacrificial material layer 278b. Sacrificial material layer 278b is etched to provide openings 284 to expose at least a portion of the sidewalls of doped semiconductor lines 202 and to provide sacrificial material layer 278c.

Figure 40:
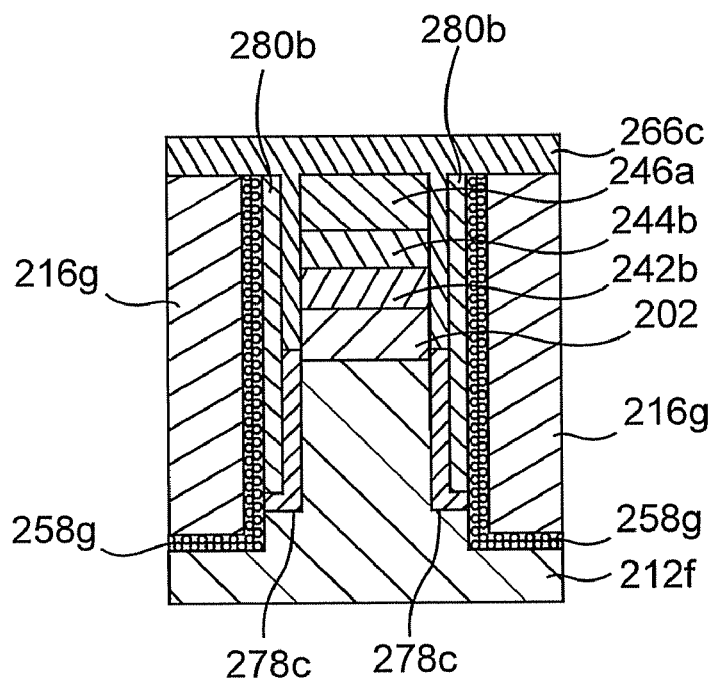
FIG. 40 illustrates a cross-sectional view of one embodiment of the substrate, the doped semiconductor lines, the hard mask material layer, the sacrificial material layer, the spacers, the STI passivation material, the STI fill material, and a cladding material.

FIG. 40 illustrates a cross-sectional view of one embodiment of substrate 212f, doped semiconductor lines 202, 242b, and 244b, hard mask material layer 246a, sacrificial material layer 278c, spacers 280b, STI passivation material 258g, STI fill material 216g, and a cladding material 266c. A cladding material, such as C, TiN, or another suitable conductive material is deposited over exposed portions of hard mask material layer 246a, doped semiconductor lines 202, 242b, and 244b, sacrificial material layer 278c, STI passivation material 258g, STI fill material 216g, and substrate 212f to provide cladding material 266c. Cladding material 266c is deposited using CVD, HDP-CVD, ALD, MOCVD, PVD, JVP, or other suitable deposition technique.

Figure 41:
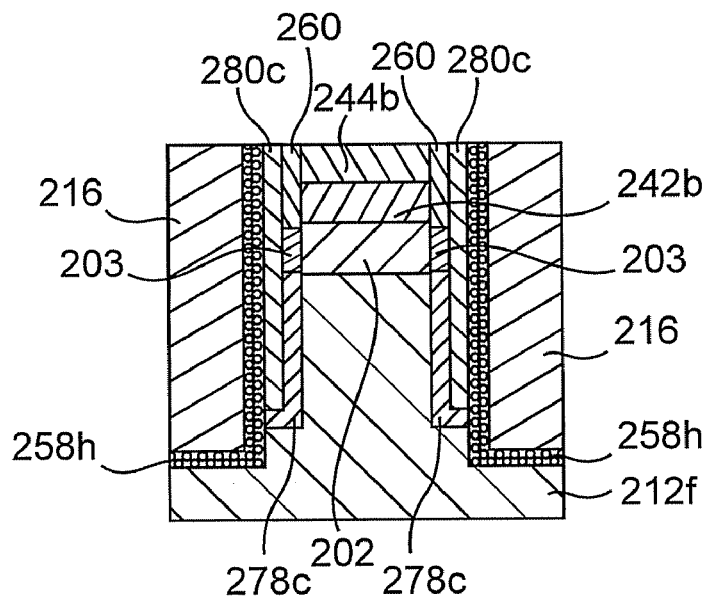
FIG. 41 illustrates a cross-sectional view of one embodiment of the substrate, the doped semiconductor lines, the sacrificial material layer, the spacers, the STI passivation material, the STI fill material, conductive cladding, and a dielectric material.

FIG. 41 illustrates a cross-sectional view of one embodiment of substrate 212f, doped semiconductor lines 202, 242b, and 244b, sacrificial material layer 278c, spacers 280c, STI passivation material 258h, STI fill material 216, conductive cladding 203, and dielectric material 260. Cladding material 266c, hard mask material layer 246a, spacers 280b, STI passivation material 258g, and STI fill material 216g are planarized to expose doped semiconductor lines 244b to provide spacers 280c, STI passivation material 258h, and STI fill material 216. Cladding material 266c, hard mask material layer 246a, spacers 280b, STI passivation material 258g, and STI fill material 216g are planarized using CMP or another suitable planarization technique. The cladding material is then etched back to below doped semiconductor line 242b to provide doped semiconductor line 202 including conductive cladding 203 as previously described and illustrated with reference to FIG. 3A.

A dielectric material, such as $SiO_2$ is deposited over conductive cladding 203, doped semiconductor line 244b, spacers 280c, STI passivation material 258h, and STI fill material 216 to provide a dielectric material layer. The dielectric material layer is deposited using CVD, HDP-CVD, ALD, MOCVD, PVD, JVP, spin-on, or other suitable deposition technique. The dielectric material layer is then planarized to expose doped semiconductor line 244b and to provide dielectric material 260. The dielectric material layer is planarized using CMP or another suitable planarization technique.

The following FIGS. 42-47 illustrate embodiments for fabricating doped semiconductor lines 202 including conductive cladding 203 as previously described and illustrated with reference to FIG. 3A. The fabrication process begins as previously described and illustrated with reference to FIGS. 13-15.

Figure 42:
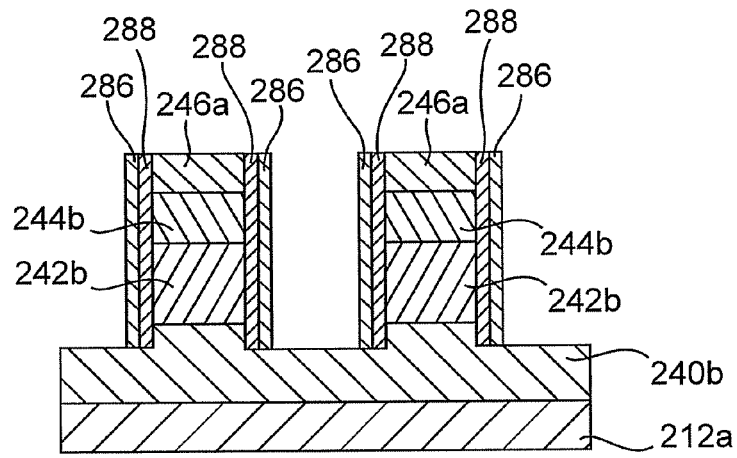
FIG. 42 illustrates a cross-sectional view of one embodiment of the substrate, the doped semiconductor region, the doped semiconductor lines, the hard mask material layer, isolating spacers, and sacrificial spacers.

FIG. 42 illustrates a cross-sectional view of one embodiment of substrate 212a, doped semiconductor region 240b, doped semiconductor lines 242b and 244b, hard mask material layer 246a, isolating spacers 288, and sacrificial spacers 286. A dielectric material, such as $SiO_2$ or another suitable dielectric material is deposited over exposed portions of hard mask material layer 246a, doped semiconductor region 240b, and doped semiconductor lines 242b and 244b to provide a dielectric material layer. The dielectric material layer is deposited using CVD, HDP-CVD, ALD, MOCVD, PVD, JVP, or other suitable deposition technique. The dielectric material layer is then spacer etched to expose doped semiconductor region 240b and hard mask material layer 246a and to provide isolating spacers 288.

A sacrificial material, such as C, W, Al, Ti, or another suitable material is deposited over hard mask material layer 246a, isolating spacers 288, and doped semiconductor region 240b to provide a sacrificial material layer. The sacrificial material layer is deposited using CVD, HDP-CVD, ALD, MOCVD, PVD, JVP, or other suitable deposition technique. The sacrificial material layer is then spacer etched to expose doped semiconductor region 240b and hard mask material layer 246a and to provide sacrificial spacers 286.

Figure 43:
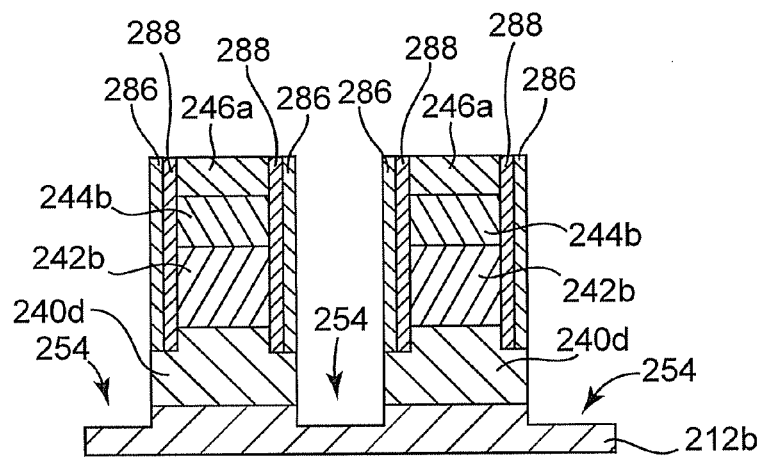
FIG. 43 illustrates a cross-sectional view of one embodiment of the substrate, the doped semiconductor lines, the hard mask material layer, the isolating spacers, and the sacrificial spacers after etching portions of the doped semiconductor region and the substrate.

FIG. 43 illustrates a cross-sectional view of one embodiment of substrate 212b, doped semiconductor lines 240d, 242b, and 244b, hard mask material layer 246a, isolating spacers 288, and sacrificial spacers 286 after etching portions of the doped semiconductor region 240b and substrate 212a. Exposed portions of doped semiconductor region 240b and underlying portions of substrate 212a are etched to provide openings 254 and doped semiconductor lines 240d and substrate 212b.

Figure 44:
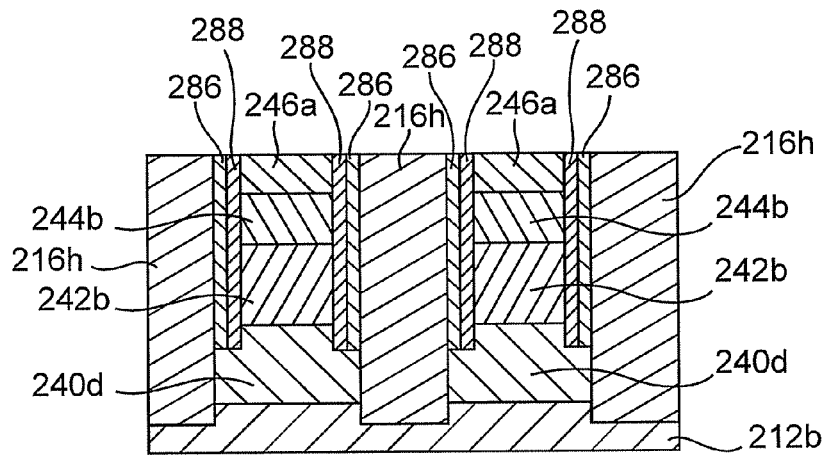
FIG. 44 illustrates a cross-sectional view of one embodiment of the substrate, the doped semiconductor lines, the hard mask material layer, the isolating spacers, the sacrificial spacers, and STI fill material.

FIG. 44 illustrates a cross-sectional view of one embodiment of substrate 212b, doped semiconductor lines 240d, 242b, and 244b, hard mask material layer 246a, isolating spacers 288, sacrificial spacers 286, and STI fill material 216h. Exposed portions of sacrificial spacers 286 and substrate 212b are subjected to an STI passivation process to oxidize the exposed surfaces of sacrificial spacers 286 and substrate 212b to provide STI passivation material (not shown).

An STI fill material, such as $SiO_2$, FSG, BPSG, BSG, or other suitable dielectric material is deposited over exposed portions of hard mask material layer 246a, isolating spacers 288, sacrificial spacers 286, doped semiconductor lines 240d, and substrate 212b. The STI fill material is deposited using CVD, HDP-CVD, ALD, MOCVD, PVD, JVP, spin-on, or other suitable deposition technique. The STI fill material is then planarized to expose hard mask material layer 246a, isolating spacers 288, and sacrificial spacers 286 and to provide STI fill material 216h.

Figure 45:
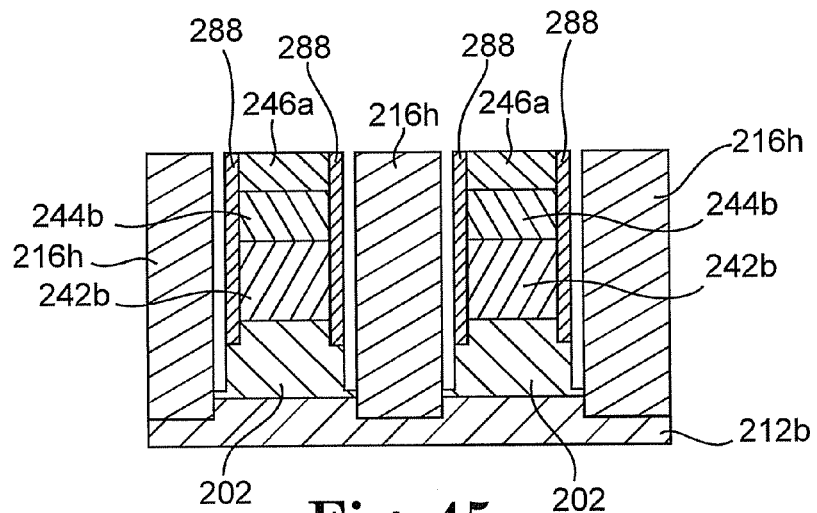
FIG. 45 illustrates a cross-sectional view of one embodiment of the substrate, the doped semiconductor lines, the hard mask material layer, the isolating spacers, and the STI fill material after etching the sacrificial spacers and portions of the doped semiconductor lines.

FIG. 45 illustrates a cross-sectional view of one embodiment of substrate 212b, doped semiconductor lines 202, 242b, and 244b, hard mask material layer 246a, isolating spacers 288, and STI fill material 216h after removing sacrificial spacers 286 and etching underlying portions of doped semiconductor lines 240d. Sacrificial spacers 286 are removed and underlying portions of doped semiconductor lines 240d are etched to provide doped semiconductor lines 202.

Figure 46:
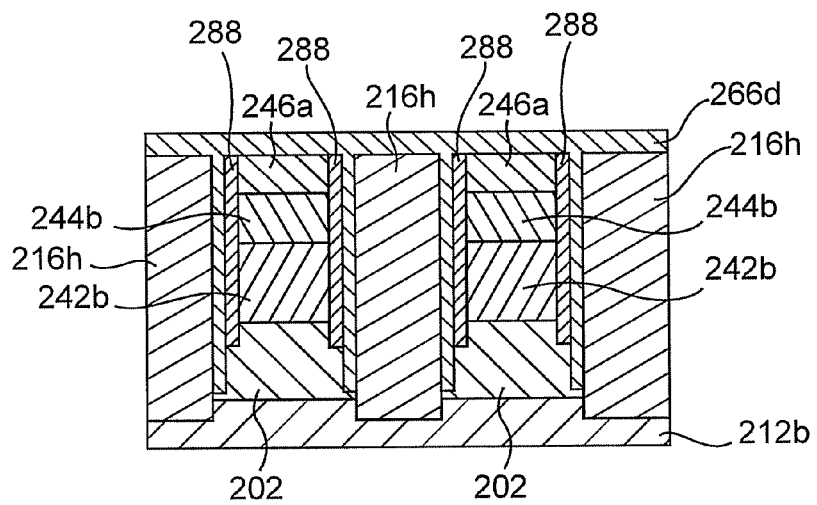
FIG. 46 illustrates a cross-sectional view of one embodiment of the substrate, the doped semiconductor lines, the hard mask material layer, the isolating spacers, the STI fill material, and a cladding material.

FIG. 46 illustrates a cross-sectional view of one embodiment of substrate 212b, doped semiconductor lines 202, 242b, and 244b, hard mask material layer 246a, isolating spacers 288, STI fill material 216h, and a cladding material 266d. A cladding material, such as C, TiN, or another suitable conductive material is deposited over exposed portions of hard mask material layer 246a, isolating spacers 288, STI fill material 216h, and doped semiconductor lines 202 to provide cladding material 266d. Cladding material 266d is deposited using CVD, HDP-CVD, ALD, MOCVD, PVD, JVP, or other suitable deposition technique.

Figure 47:
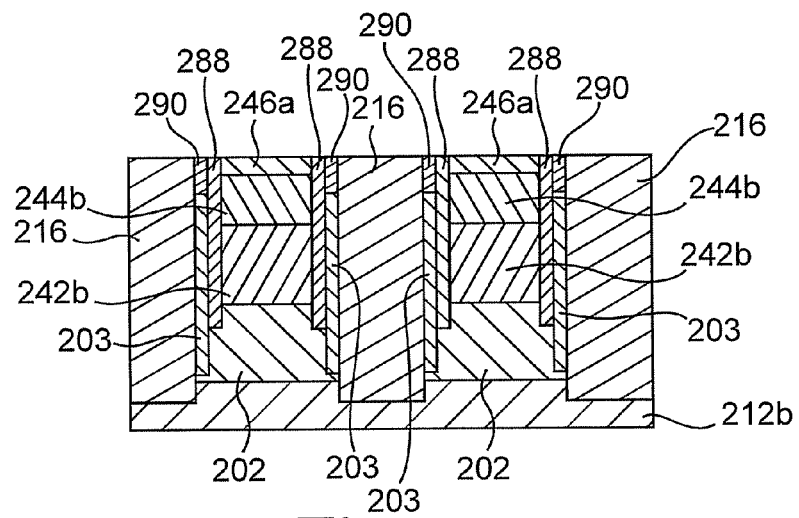
FIG. 47 illustrates a cross-sectional view of one embodiment of the substrate, the doped semiconductor lines, the hard mask material layer, the isolating spacers, the STI fill material, conductive cladding, and a dielectric material.

FIG. 47 illustrates a cross-sectional view of one embodiment of substrate 212b, doped semiconductor lines 202, 242b, and 244b, hard mask material layer 246a, isolating spacers 288, STI fill material 216, conductive cladding 203, and a dielectric material 290. Cladding material 266d is planarized to expose hard mask material layer 246a, isolating spacers 288, and STI fill material 216. Cladding material 266d is planarized using CMP or another suitable planarization technique. In one embodiment, hard mask material layer 246a is thinned or removed completely during the planarization process. The cladding material is then etched back to expose a portion of the sidewalls of isolating spacers 288 and STI fill material 216 to provide conductive cladding 203.

A dielectric material, such as $SiO_2$ is deposited over conductive cladding 203, hard mask material layer 246a, isolating spacers 288, and STI fill material 216 to provide a dielectric material layer. The dielectric material layer is deposited using CVD, HDP-CVD, ALD, MOCVD, PVD, JVP, spin-on, or other suitable deposition technique. The dielectric material layer is then planarized to expose hard mask material layer 246a and to provide dielectric material 290. The dielectric material layer is planarized using CMP or another suitable planarization technique.

The following FIGS. 48-54 illustrate embodiments for fabricating doped semiconductor lines 202 including conductive cladding 203 as previously described and illustrated with reference to FIG. 3A. The fabrication process begins as previously described and illustrated with reference to FIGS. 13-15.

Figure 48:
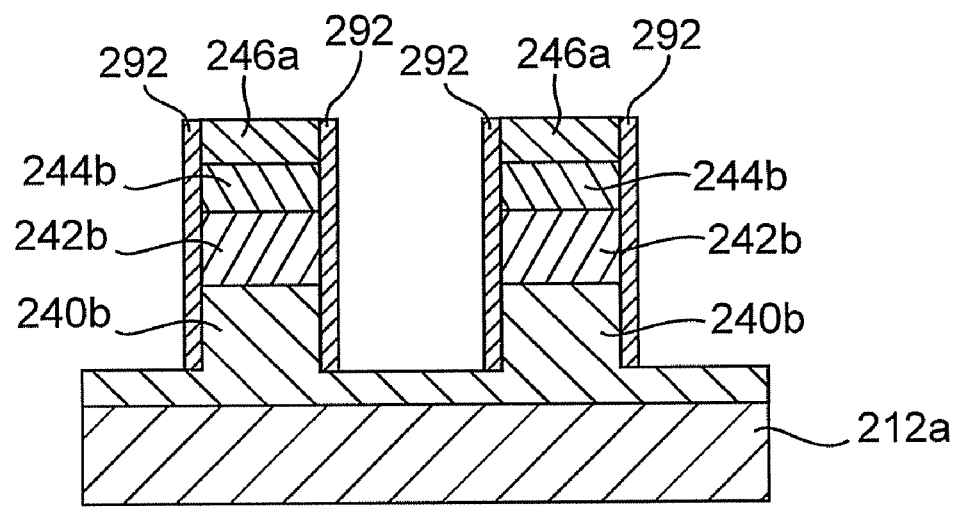
FIG. 48 illustrates a cross-sectional view of one embodiment of the substrate, the doped semiconductor region, the doped semiconductor lines, the hard mask material layer, and a cladding material.

FIG. 48 illustrates a cross-sectional view of one embodiment of substrate 212a, doped semiconductor region 240b, doped semiconductor lines 242b and 244b, hard mask material layer 246a, and cladding material 292. A cladding material, such as C, TiN, or another suitable conductive material is deposited over exposed portions of hard mask material layer 246a, doped semiconductor region 240b, and doped semiconductor lines 242b and 244b to provide a cladding material layer. The cladding material layer is deposited using CVD, HDP-CVD, ALD, MOCVD, PVD, JVP, or other suitable deposition technique. The cladding material layer is then spacer etched to provide cladding material 292.

Figure 49:
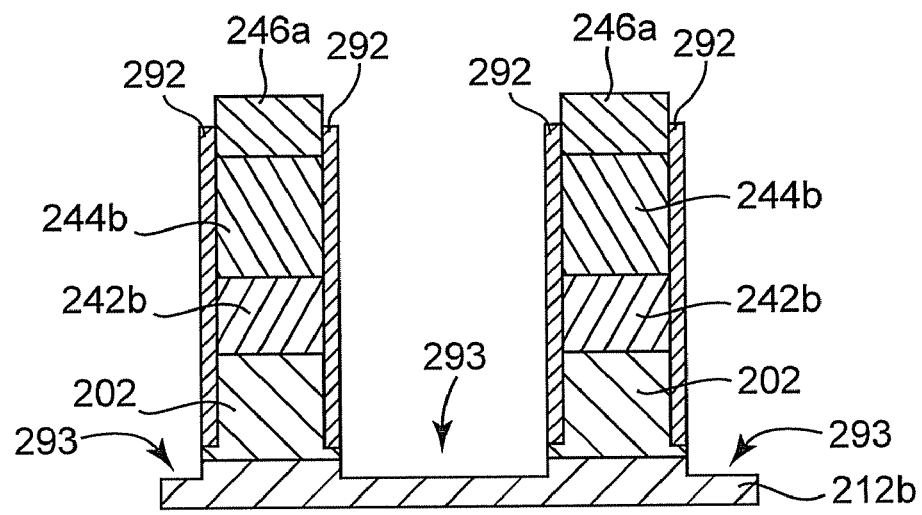
FIG. 49 illustrates a cross-sectional view of one embodiment of the substrate, the doped semiconductor lines, the hard mask material layer, and the cladding material after etching portions of the doped semiconductor region and the substrate.

FIG. 49 illustrates a cross-sectional view of one embodiment of substrate 212b, doped semiconductor lines 202, 242b, and 244b, hard mask material layer 246a, and cladding material 292 after etching portions of the doped semiconductor region 240b and substrate 212a. Exposed portions of doped semiconductor region 240b and underlying portions of substrate 212a are etched to provide opening 293 and doped semiconductor lines 202 and substrate 212b.

Figure 50:
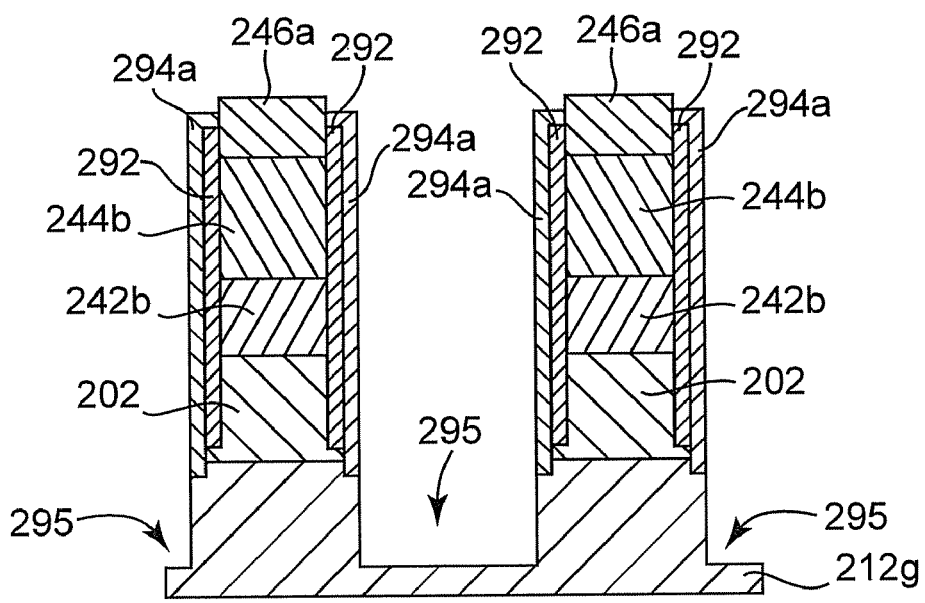
FIG. 50 illustrates a cross-sectional view of one embodiment of the substrate, the doped semiconductor lines, the hard mask material layer, the cladding material, and spacers.

FIG. 50 illustrates a cross-sectional view of one embodiment of substrate 212g, doped semiconductor lines 202, 242b, and 244b, hard mask material layer 246a, cladding material 292, and spacers 294a. A dielectric material, such as SiN or another suitable dielectric material is deposited over exposed portions of hard mask material layer 246a, cladding material 292, doped semiconductor lines 202, and substrate 212b to provide a dielectric material layer. The dielectric material layer is spacer etched to expose substrate 212b and to provide spacers 294a. The exposed portions of substrate 212b are then etched to provide openings 295 and to provide substrate 212g.

Figure 51:
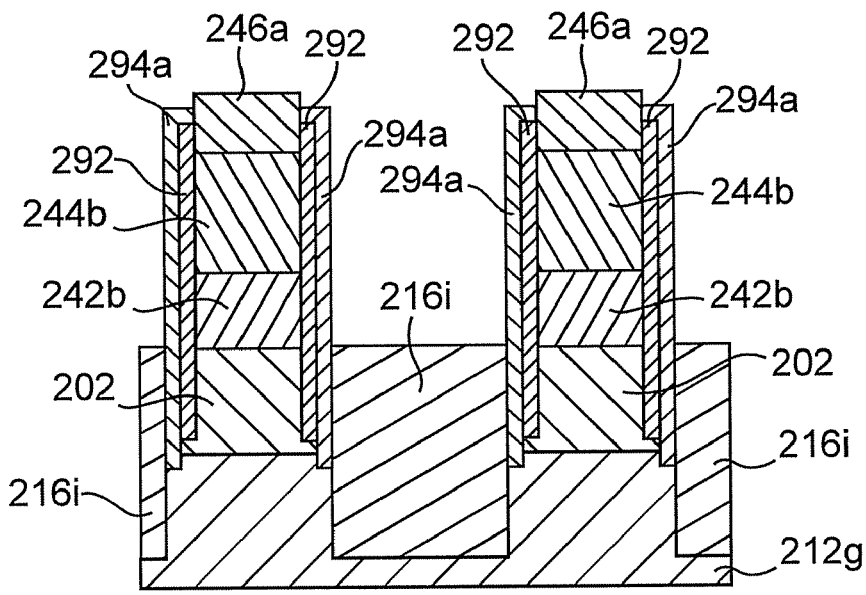
FIG. 51 illustrates a cross-sectional view of one embodiment of the substrate, the doped semiconductor lines, the hard mask material layer, the cladding material, the spacers, and STI fill material.

FIG. 51 illustrates a cross-sectional view of one embodiment of substrate 212g, doped semiconductor lines 202, 242b, and 244b, hard mask material layer 246a, cladding material 292, spacers 294a, and STI fill material 216i. Exposed portions of spacers 294a and substrate 212g are subjected to an STI passivation process to oxidize the exposed surfaces of spacers 294a and substrate 212g to provide STI passivation material (not shown).

An STI fill material, such as $SiO_2$, FSG, BPSG, BSG, or other suitable dielectric material is deposited over hard mask material layer 246a, spacers 292a, and substrate 212g. The STI fill material is deposited using CVD, HDP-CVD, ALD, MOCVD, PVD, JVP, spin-on, or other suitable deposition technique. The STI fill material is then recess etched to below doped semiconductor line 242b to provide STI fill material 216i.

Figure 52:
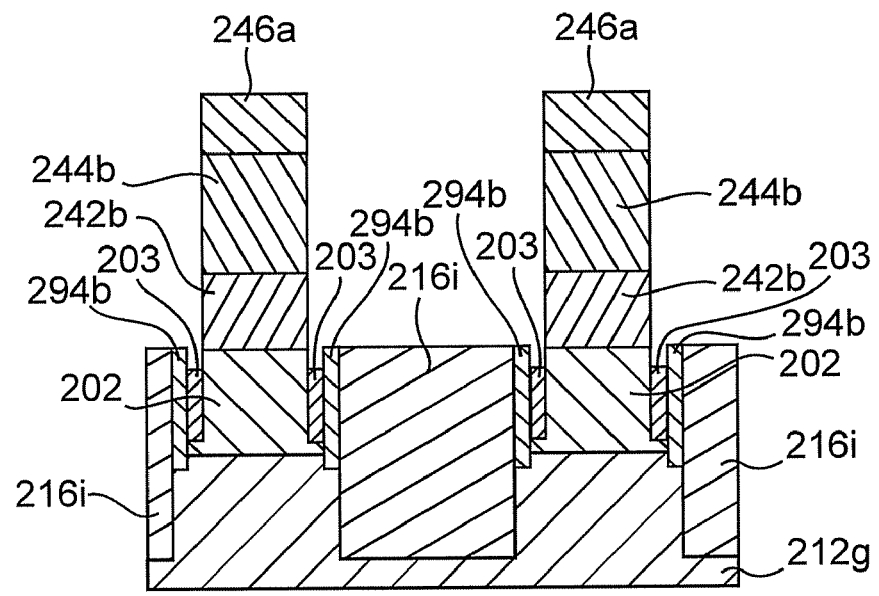
FIG. 52 illustrates a cross-sectional view of one embodiment of the substrate, the doped semiconductor lines, the hard mask material layer, conductive cladding, the spacers, and the STI fill material after etching the spacers and the cladding material.

FIG. 52 illustrates a cross-sectional view of one embodiment of substrate 212g, doped semiconductor lines 202, 242b, and 244b, hard mask material layer 246a, conductive cladding 203, spacers 294b, and STI fill material 216i after etching spacers 294a and cladding material 292. Spacers 294a are etched using an isotropic etch or another suitable etch to provide spacers 294b. Conductive cladding 292 is etched to below doped semiconductor lines 242b to provide conductive cladding 203.

Figure 53:
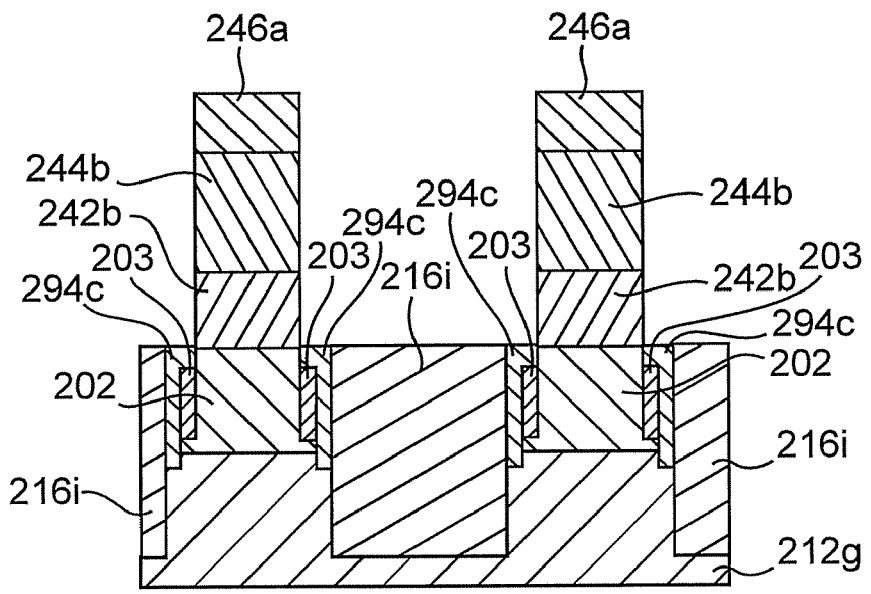
FIG. 53 illustrates a cross-sectional view of one embodiment of the substrate, the doped semiconductor lines, the hard mask material layer, the conductive cladding, the spacers, and the STI fill material.

FIG. 53 illustrates a cross-sectional view of one embodiment of substrate 212g, doped semiconductor lines 202, 242b, and 244b, hard mask material layer 246a, conductive cladding 203, spacers 294c, and STI fill material 216i. A dielectric material, such as SiN or another suitable dielectric material is deposited over exposed portions of hard mask material layer 246a, doped semiconductor lines 202, 242b, and 244b, conductive cladding 203, spacers 294b, and STI fill material 216i to provide a dielectric material layer. The dielectric material layer is deposited using CVD, HDP-CVD, ALD, MOCVD, PVD, JVP, or other suitable deposition technique. The dielectric material layer is then etched back using an isotropic etch or another suitable etching process to provide spacers 294c, which include spacers 294b and cap conductive cladding 203.

Figure 54:
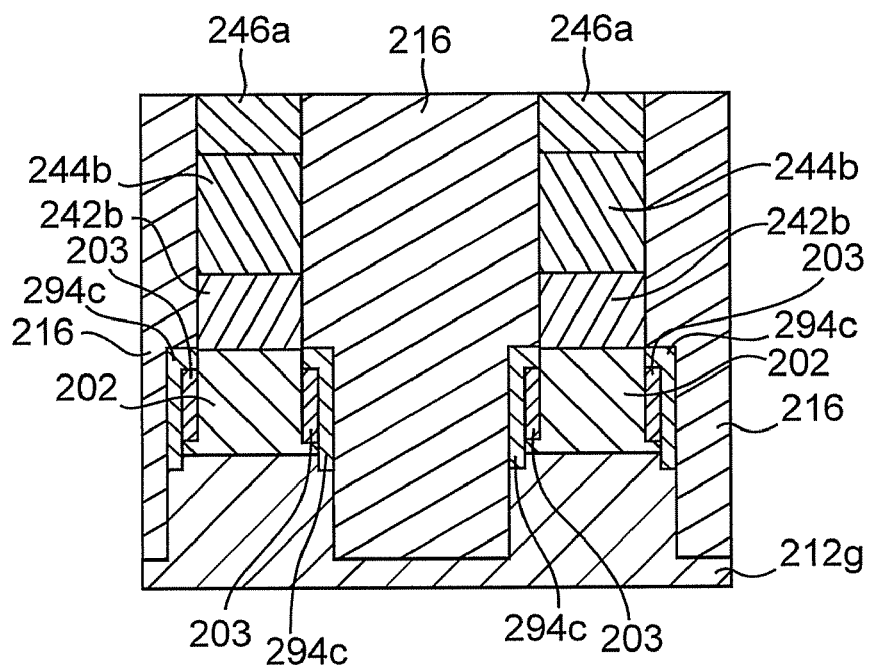
FIG. 54 illustrates a cross-sectional view of one embodiment of the substrate, the doped semiconductor lines, the hard mask material layer, the conductive cladding, the spacers, and STI fill material.

FIG. 54 illustrates a cross-sectional view of one embodiment of substrate 212g, doped semiconductor lines 202, 242b, and 244b, hard mask material layer 246a, conductive cladding 203, spacers 294c, and STI fill material 216. Exposed portions of doped semiconductor lines 242b and 244b are subjected to an STI passivation process to oxidize the exposed surfaces of doped semiconductor lines 242b and 244b to provide STI passivation material (not shown).

An STI fill material, such as $SiO_2$, FSG, BPSG, BSG, or other suitable dielectric material is deposited over exposed portions of hard mask material layer 246a, spacers 294c, and the STI passivation material. The STI fill material is deposited using CVD, HDP-CVD, ALD, MOCVD, PVD, JVP, spin-on, or other suitable deposition technique. The STI fill material is then planarized to expose hard mask material layer 246a and to provide STI fill material 216.

Figure 55:
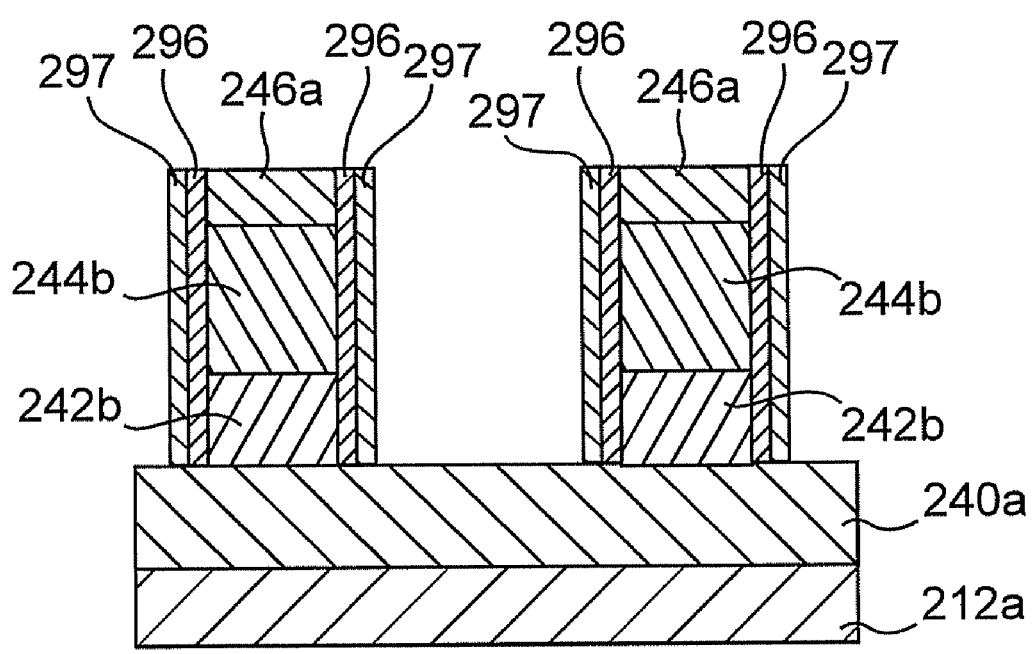
FIG. 55 illustrates a cross-sectional view of one embodiment of the substrate, the doped semiconductor region, the doped semiconductor lines, the hard mask material layer, isolating spacers, and spacers.
Figure 56:
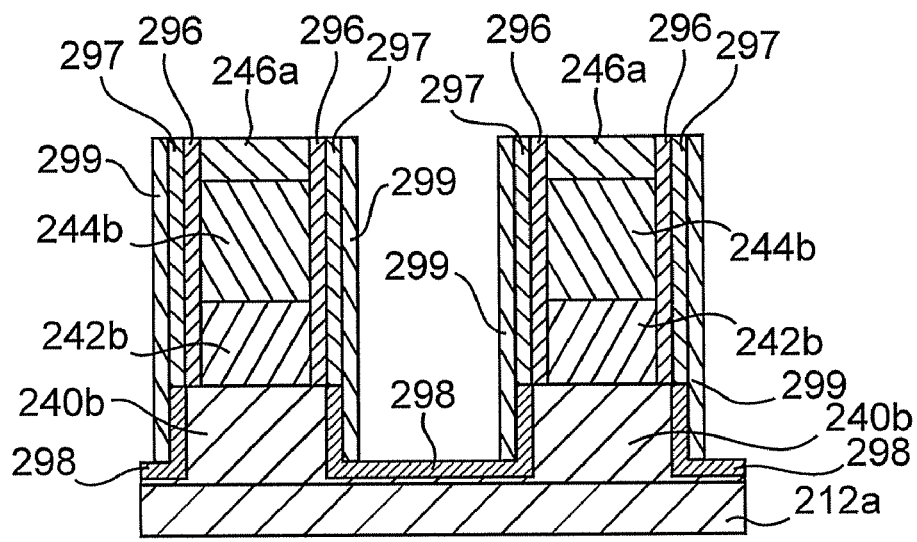
FIG. 56 illustrates a cross-sectional view of one embodiment of the substrate, the doped semiconductor region, the doped semiconductor lines, the hard mask material layer, the isolating spacers, the spacers, and a gas immersion laser doping material.
Figure 57:
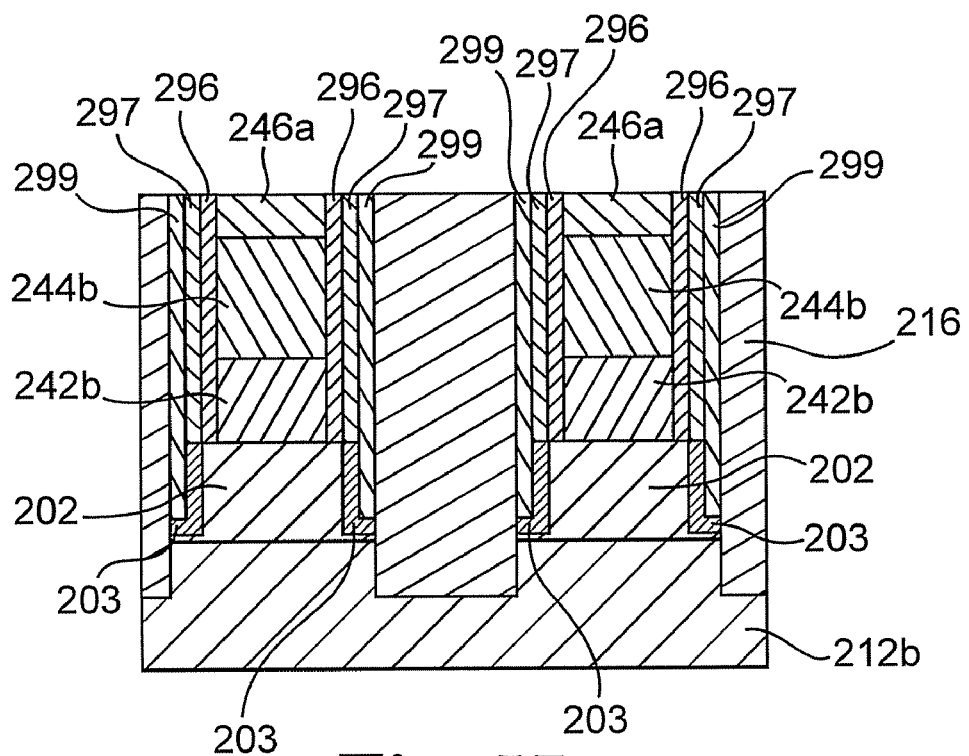
FIG. 57 illustrates a cross-sectional view of one embodiment of the substrate, the doped semiconductor lines, the hard mask material layer, the isolating spacers, the spacers, conductive cladding, and STI fill material.

The following FIGS. 55-57 illustrate embodiments for fabricating doped semiconductor lines 202 including conductive cladding 203 as previously described and illustrated with reference to FIG. 3A. The fabrication process begins as previously described and illustrated with reference to FIGS. 13-15 except that doped region 240a is not etched.

FIG. 55 illustrates a cross-sectional view of one embodiment of substrate 212a, doped semiconductor region 240a, doped semiconductor lines 242b and 244b, hard mask material layer 246a, isolating spacers 296, and spacers 297. A dielectric material, such as $SiO_2$ or another suitable dielectric material is deposited over exposed portions of hard mask material layer 246a, doped semiconductor region 240a, and semiconductor lines 242b and 244b to provide a dielectric material layer. The dielectric material layer is deposited using CVD, HDP-CVD, ALD, MOCVD, PVD, JVP, or other suitable deposition technique. The dielectric material layer is then spacer etched to expose doped semiconductor region 240a and hard mask material layer 246a and to provide isolating spacers 296.

A dielectric material, such as SiN or another suitable dielectric material is deposited over exposed portions of hard mask material layer 246a, isolating spacers 296, and doped region 240a to provide a dielectric material layer. The dielectric material layer is deposited using CVD, HDP-CVD, ALD, MOCVD, PVD, JVP, or other suitable deposition technique. The dielectric material layer is then spacer etched to expose doped semiconductor region 240a and hard mask material layer 246a and to provide spacers 297.

FIG. 56 illustrates a cross-sectional view of one embodiment of substrate 212a, doped semiconductor region 240b, doped semiconductor lines 242b and 244b, hard mask material layer 246a, isolating spacers 296, spacers 297, gas immersion laser doping (GILD) material 298, and spacers 299. Exposed portions of doped semiconductor region 240a are etched to provide doped region 240b without etching through to substrate 212a. The exposed portions of doped semiconductor region 240b are then subjected to a gas immersion laser doping process. In one embodiment, $BCl_3$ is used as the dopant in the GILD process to provide GILD material 298.

A dielectric material, such as SiN or another suitable dielectric material is deposited over exposed portions of hard mask material layer 246a, spacers 297, and GILD material 298 to provide a dielectric material layer. The dielectric material layer is deposited using CVD, HDP-CVD, ALD, MOCVD, PVD, JVP, or other suitable deposition technique. The dielectric material layer is then spacer etched to expose GILD material 298 and hard mask material layer 246a and to provide spacers 299.

FIG. 57 illustrates a cross-sectional view of one embodiment of substrate 212b, doped semiconductor lines 202, 242b, and 244b, hard mask material layer 246a, isolating spacers 296, spacers 297 and 299, conductive cladding 203, and STI fill material 216. The exposed portions of GILD material 298 and underlying portions of doped semiconductor region 240b and substrate 212a are etched to provide conductive cladding 203, doped semiconductor lines 202 and substrate 212b. In one embodiment, spacers 296, 297, and/or 299 are removed.

Exposed portions of spacers 299 and substrate 212b are subjected to an STI passivation process to oxidize the exposed surfaces of spacers 299 and substrate 212b to provide STI passivation material (not shown). An STI fill material, such as $SiO_2$, FSG, BPSG, BSG, or other suitable dielectric material is deposited over hard mask material layer 246a, spacers 296, 297, and 299, and substrate 212b. The STI fill material is deposited using CVD, HDP-CVD, ALD, MOCVD, PVD, JVP, spin-on, or other suitable deposition technique. The STI fill material is then planarized to expose hard mask material layer 246a and to provide STI fill material 216.

The following FIG. 58-61 illustrate embodiments for fabricating vertical diodes 109 from doped semiconductor lines 242b and 244b following the fabrication processes previously described and illustrated with reference to FIGS. 21, 29, 41, 47, 54, and 57.

Figure 58:
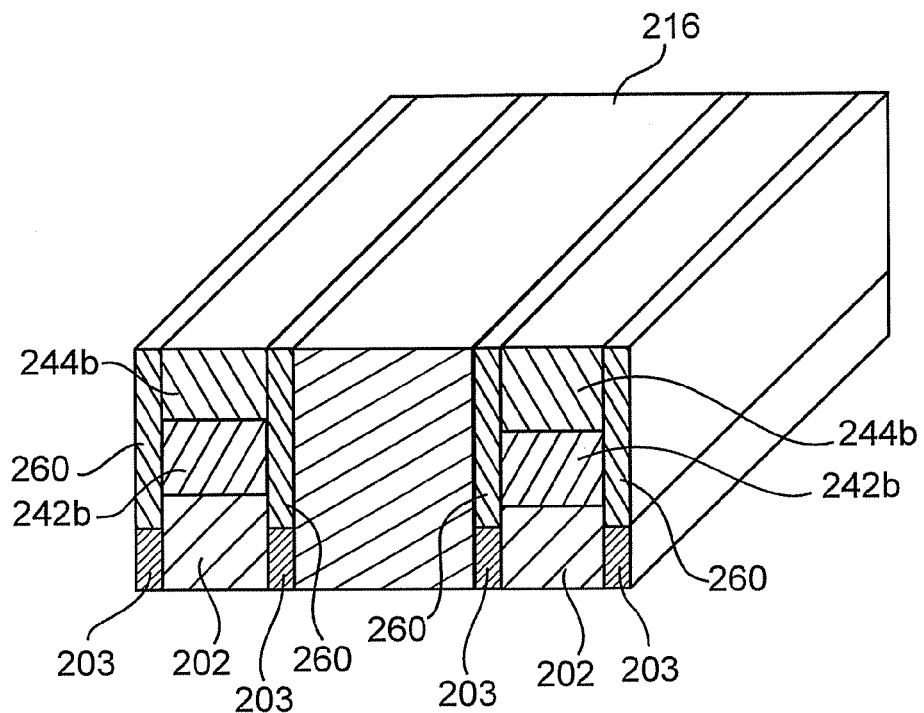
FIG. 58 illustrates a perspective view of one embodiment of the doped semiconductor lines, the conductive cladding, dielectric material, and STI fill material.

FIG. 58 illustrates a perspective view of one embodiment of doped semiconductor lines 202, 242b, and 244, conductive cladding 203, dielectric material 260, and STI fill material 216. In other embodiments, other configurations are used with doped semiconductor lines 202, 242b, and 244b as previously described.

Figure 59:
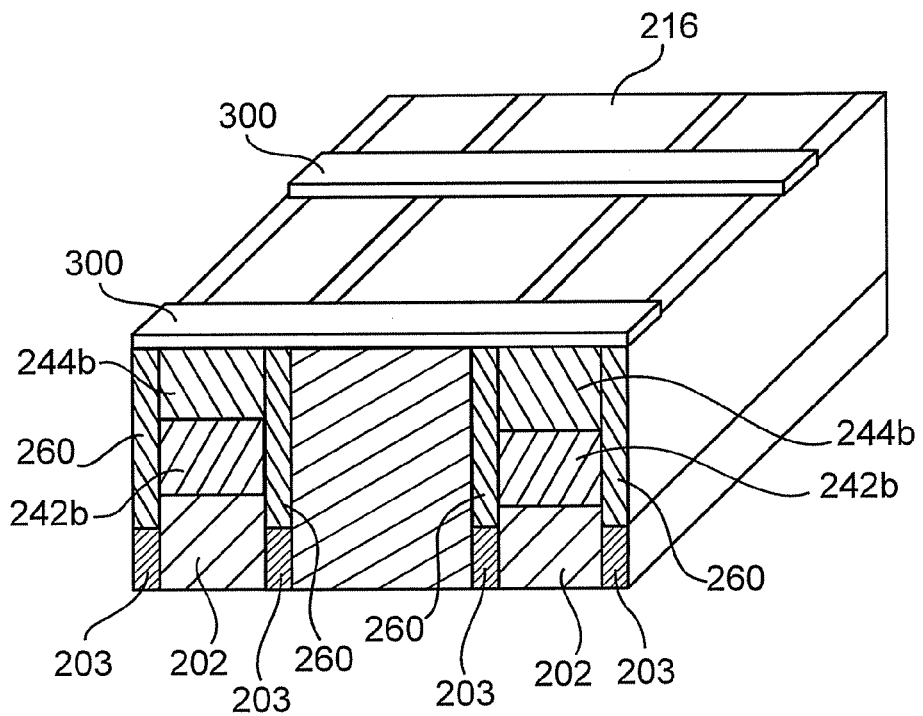
FIG. 59 illustrates a perspective view of one embodiment of the doped semiconductor lines, the conductive cladding, the dielectric material, the STI fill material, and a hard mask.

FIG. 59 illustrates a perspective view of one embodiment of doped semiconductor lines 202, 242b, and 244b, conductive cladding 203, dielectric material 260, STI fill material 216, and a hard mask material layer 300. A hard mask material, such as SiN or another suitable material is deposited over doped semiconductor lines 244b, dielectric material 260, and STI fill material 216 to provide a hard mask material layer. The hard mask material layer is deposited using CVD, HDP-CVD, ALD, MOCVD, PVD, JVP, or other suitable deposition technique. The hard mask material layer is then etched to expose portions of semiconductor lines 244b, dielectric material 260, and STI fill material 216 to provide hard mask material layer 300.

Figure 60:
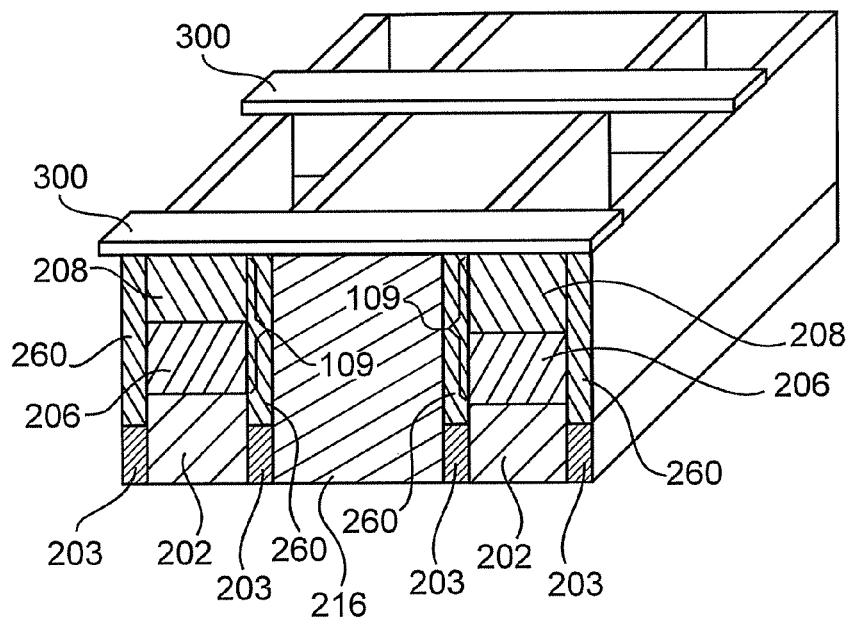
FIG. 60 illustrates a perspective view of one embodiment of the doped semiconductor lines, the dielectric material, the conductive cladding, diodes, the STI fill material, and the hard mask.

FIG. 60 illustrates a perspective view of one embodiment of doped semiconductor lines 202, dielectric material 260, conductive cladding 203, diodes 109, STI fill material 216, and hard mask material layer 300. The exposed portions of doped semiconductor lines 244b and underlying portions of doped semiconductor lines 242b are etched to expose portions of doped semiconductor lines 202 to provide diodes 109 including doped regions 206 and 208.

FIG. 61 illustrates a perspective view of one embodiment of doped semiconductor lines 202, dielectric material 260, conductive cladding 203, diodes 109, and STI fill material 302. Hard mask material layer 300 is optionally removed. Exposed portions of dielectric material 260, doped semiconductor lines 202 and doped regions 206 and 208 are subjected to an STI passivation process to oxidize the exposed surfaces of doped semiconductor lines 202 and doped regions 206 and 208 to provide STI passivation material (not shown). An STI fill material, such as $SiO_2$, FSG, BPSG, BSG, or other suitable dielectric material is deposited over dielectric material 260, doped semiconductor lines 202, and doped regions 206 and 208. The STI fill material is deposited using CVD, HDP-CVD, ALD, MOCVD, PVD, JVP, spin-on, or other suitable deposition technique. The STI fill material is then planarized to provide STI fill material 302. A process similar to the process previously described and illustrated with reference to FIG. 9 is then performed to fabricate contacts 224.

Embodiments provide doped semiconductor lines including conductive cladding. The lines can be used as memory cell select lines within an array of memory cells. The lines increase the current densities that can be achieved compared to unclad lines and reduce cross-talk between diode select devices in a memory array. In addition, the lines have a low resistivity such that the lines can be used without area consuming stitching to back end of line (BEOL) metallization levels.

While the specific embodiments described herein substantially focused on using phase change memory elements, the present invention is applicable to any suitable type of resistive or resistivity changing memory elements. In addition, the embodiments are applicable to any suitable integrated circuit in which conductive lines contacting diodes are used.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
    an array of memory cells, each memory cell comprising a diode;
    a doped semiconductor line formed in a semiconductor substrate, the doped semiconductor line coupled to a row of diodes; and
    conductive cladding contacting the doped semiconductor line.

2. The integrated circuit of claim 1, wherein the doped semiconductor line comprises doped silicon.

3. The integrated circuit of claim 1, wherein the conductive cladding contacts a first sidewall and a second sidewall of the doped semiconductor line.

4. The integrated circuit of claim 1, wherein the conductive cladding comprises one of C, TiN, a silicide, and a gas immersion laser doped material.

5. The integrated circuit of claim 1, further comprising:
    spacers contacting a first sidewall and a second sidewall of each diode in the row,
    wherein the conductive cladding contacts the spacers.

6. The integrated circuit of claim 5, wherein the conductive cladding contacts sidewalls of the spacers.

7. The integrated circuit of claim 1, wherein each memory cell comprises a resistivity changing material coupled to the diode.

8. The integrated circuit of claim 7, wherein the resistivity changing material comprises one of phase change material and magnetic material.

9. The integrated circuit of claim 1, wherein each memory cell comprises a vertical diode.

10. A method for fabricating the integrated circuit of claim 1, the method comprising:
    providing the semiconductor substrate including a doped region;
    fabricating lines of doped semiconductor material from the doped region of the semiconductor substrate;
    fabricating isolation regions between the lines of doped semiconductor material;
    fabricating conductive cladding on a first sidewall and a second sidewall of each of the lines of doped semiconductor material; and
    fabricating a plurality of diodes coupled to each of the lines of doped semiconductor material.

11. The method of claim 10, wherein fabricating the conductive cladding comprises fabricating conductive cladding comprising one of C, TiN, a silicide, and a gas immersion laser doped material.

12. The method of claim 10, wherein fabricating the plurality of diodes comprises:
    depositing a first doped semiconductor material layer having a first polarity over the lines of doped semiconductor material;
    depositing a second doped semiconductor material layer having a second polarity opposite the first polarity over the first doped semiconductor material layer; and
    etching first and second doped semiconductor material layers to provide the plurality of diodes.

13. The method of claim 10, wherein fabricating the plurality of diodes comprises fabricating a plurality of vertical diodes.

14. The method of claim 10, wherein fabricating the plurality of diodes comprises:
    depositing a dielectric material layer over the lines of doped semiconductor material, the isolation regions, and the conductive cladding;
    etching the dielectric material layer to provide openings exposing portions of each line of doped semiconductor material; and
    fabricating a diode within each opening.

15. The method of claim 14, wherein fabricating a diode within each opening comprises:
    depositing a semiconductor material into each opening; and
    doping the semiconductor material within each opening to provide a diode within each opening.

16. The method of claim 14, wherein fabricating a diode within each opening comprises:
    depositing a first doped semiconductor material having a first polarity into each opening; and
    depositing a second doped semiconductor material having a second polarity opposite the first polarity into each opening over the first doped semiconductor material.

17. A method for fabricating the integrated circuit of claim 1, the method comprising:
    providing the semiconductor substrate including a heavily doped first layer having a first polarity, a lightly doped second layer having the first polarity, and a doped third layer having a second polarity opposite the first polarity, the second layer over the first layer and the third layer over the second layer;
    etching the first, second, and third layers to provide first, second, and third lines of doped semiconductor material, respectively;
    fabricating isolation regions between the first lines of doped semiconductor material;
    fabricating conductive cladding on a first sidewall and a second sidewall of each first line of doped semiconductor material; and
    etching the second and third lines of doped semiconductor material to provide a plurality of diodes contacting the first lines of doped semiconductor material.

18. The method of claim 17, wherein fabricating the conductive cladding comprises:
depositing a dielectric material layer over the first, second, and third lines of doped semiconductor material and the isolation regions;
etching the dielectric material layer to expose the isolation regions;
etching the isolation regions to expose the substrate;
selectively etching the substrate and the first lines of doped semiconductor material to provide openings; and
depositing cladding material into the openings to provide the conductive cladding.

19. The method of claim 17, wherein fabricating the conductive cladding comprises:
forming isolating spacers on sidewalls of the second and third lines of doped semiconductor material;
forming sacrificial spacers on sidewalls of the isolating spacers;
etching the sacrificial spacers and underlying portions of the first lines of doped semiconductor material to provide openings; and
depositing cladding material into the openings to provide the conductive cladding.

20. The method of claim 17, wherein fabricating the conductive cladding comprises:
depositing cladding material on sidewalls of the first, second, and third lines of doped semiconductor material; and
removing the cladding material from the sidewalls of the second and third lines of doped semiconductor material to provide the conductive cladding.

21. The method of claim 17, wherein fabricating the conductive cladding comprises:
forming isolating spacers on sidewalls of the first and second lines of doped seimconductor material;
etching the first layer to provide the first lines of doped semiconductor material and to expose sidewalls of the first lines of doped semiconductor material; and
gas immersion laser doping the exposed sidewalls of the first lines doped semiconductor material to provide the conductive cladding.

22. The method of claim 17, wherein fabricating the conductive cladding comprises:
fabricating conductive cladding comprising one of C, TiN, a silicide, and a gas immersion laser doped material.

23. A system comprising:
a host; and
a memory device communicatively coupled to the host, the memory device comprising:
an array of memory cells, each memory cell comprising a diode coupled to a resistivity changing memory element;
a doped semiconductor line formed in a semiconductor substrate, the doped semiconductor line coupled to a row of diodes; and
conductive cladding contacting the doped semiconductor line.

24. The system of claim 23, wherein the doped semiconductor line comprises a word line.

25. The system of claim 23, wherein the memory device further comprises:
a write circuit configured to program each memory cell;
a sense circuit configured to read each memory cell; and
a controller configured to control the write circuit and the sense circuit.

* * * * *